United States Patent
Schwartz et al.

(10) Patent No.: US 6,492,916 B1
(45) Date of Patent: Dec. 10, 2002

(54) METHOD AND APPARATUS FOR GENERATING MULTIPLE SELECTABLE CONTEXTS

(75) Inventors: Edward L. Schwartz, Sunnyvale, CA (US); Michael J. Gormish, Redwood City, CA (US)

(73) Assignee: Ricoh Co., Ltd., Tokyo (JP)

( * ) Notice: Subject to any disclaimer, the term of this patent is extended or adjusted under 35 U.S.C. 154(b) by 0 days.

(21) Appl. No.: 09/823,520

(22) Filed: Mar. 30, 2001

(51) Int. Cl.[7] .............................. H03M 7/00; G06K 9/36
(52) U.S. Cl. ............................ 341/59; 341/50; 382/239
(58) Field of Search ............................ 341/50, 107, 59, 341/58, 51; 382/232, 239, 245, 247

(56) References Cited

U.S. PATENT DOCUMENTS

| | | | | |
|---|---|---|---|---|
| 5,471,207 A | * | 11/1995 | Zandi et al. | 341/107 |
| 5,694,128 A | * | 12/1997 | Kim | 341/79 |
| 5,970,174 A | * | 10/1999 | Peters | 382/238 |
| 6,222,468 B1 | * | 4/2001 | Allen | 341/107 |

* cited by examiner

Primary Examiner—Peguy JeanPierre
(74) Attorney, Agent, or Firm—Blakely, Sokoloff Taylor & Zafman LLP

(57) ABSTRACT

A method and apparatus for generating multiple selectable contexts is described. In one embodiment, the method comprises generating two contexts, one of the two contexts for when the current bit being decoded is a zero bit and the other of the two context for when the current bit being decoded is a one bit indicating that a coefficient has become significant, selecting one of the two context to use to decode a bit subsequent to the current bit, wherein selecting the one context is based on the current bit once decoded, and decoding the bit subsequent to the current bit using the one context.

13 Claims, 26 Drawing Sheets

| SP 0 | SP 4 | C 8 | C 12 | C 16 | C 20 | C 24 | C 28 |
|---|---|---|---|---|---|---|---|
| R 1 | SP 5 | C 9 | C 13 | C 17 | C 21 | C 25 | C 29 |
| R 2 | SP 6 | SP 10 | SP 14 | SP 18 | C 22 | C 26 | C 30 |
| SP 3 | SP 7 | R 11 | R 15 | SP 19 | C 23 | C 27 | C 31 |
| C 32 | SP 36 | SP 40 | SP 44 | SP 48 | C 52 | C 56 | C 60 |
| C 33 | C 37 | C 41 | C 45 | C 49 | C 53 | C 57 | C 61 |
| C 34 | C 38 | C 42 | C 46 | C 50 | C 54 | C 58 | C 62 |
| C 25 | C 39 | C 43 | C 47 | C 51 | C 55 | C 59 | C 63 |

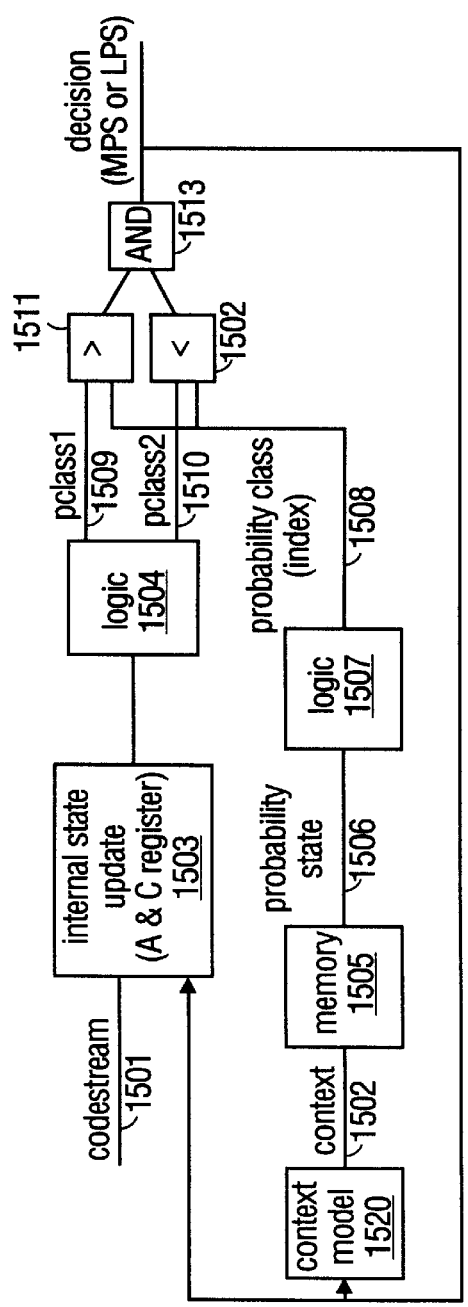
FIG. 15
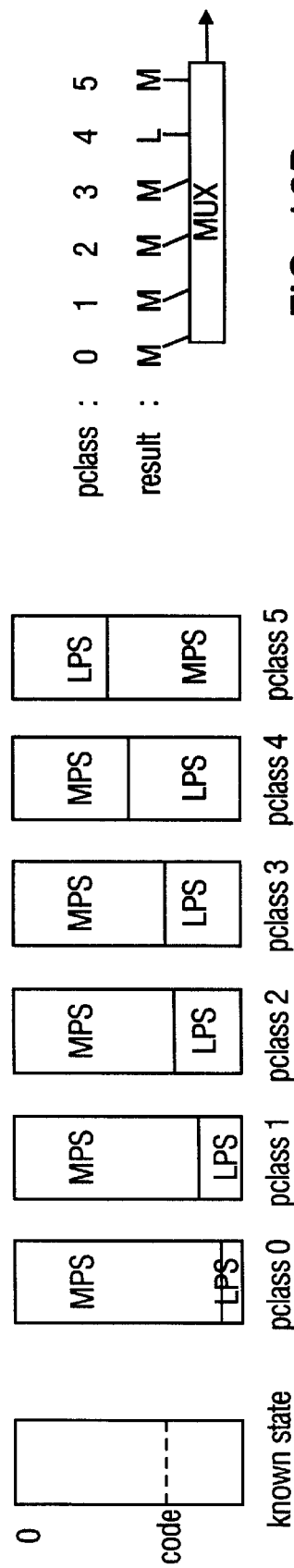
FIG. 16B
FIG. 16A

METHOD AND APPARATUS FOR GENERATING MULTIPLE SELECTABLE CONTEXTS

FIELD OF THE INVENTION

The present invention relates to the field of compression and decompression; more particularly, the present invention relates to having a context model that is capable of generating multiple contexts of which one context is selected for use in coding.

BACKGROUND OF THE INVENTION

Data compression is an extremely useful tool for storing and transmitting large amounts of data. For example, the time required to transmit an image, such as a facsimile transmission of a document, is reduced drastically when compression is used to decrease the number of bits required to represent the image.

Many different data compression techniques exist in the prior art. Compression techniques can be divided into two broad categories, lossy coding and lossless coding. Lossy coding involves coding that results in the loss of information, such that there is no guarantee of perfect reconstruction of the original data. The goal of lossy compression is that changes to the original data are done in such a way that they are not objectionable or detectable. In lossless compression, all the information is retained and the data is compressed in a manner which allows for perfect reconstruction.

In lossless compression, input symbols or intensity data are converted to output codewords. The input may include image, audio, one-dimensional (e.g., data changing spatially), two-dimensional (e.g., data changing in two spatial directions), or multi-dimensional/multi-spectral data. If the compression is successful, the codewords are represented in fewer bits than the number of bits in the "normal" representation of the input symbols (or intensity data). Lossless coding methods include dictionary methods of coding (e.g., Lempel-Ziv), run length encoding, enumerative coding and entropy coding. In lossless image compression, compression is based on predictions or. contexts, plus coding. The JBIG standard for facsimile compression and DPCM (differential pulse code modulation—an option in the JPEG standard) for continuous-tone images are examples of lossless compression for images. In lossy compression, input symbols or intensity data are quantized prior to conversion to output codewords. Quantization is intended to preserve relevant characteristics of the data while eliminating unimportant characteristics. Prior to quantization, lossy compression system often use a transform to provide energy compaction. JPEG is an example of a lossy coding method for image data.

Reversible transforms (wavelet, component) may be used for both lossy and lossless compression. Irreversible transforms (wavelet, component, discrete cosine) may be used only for lossy.

The new JPEG 2000 decoding standard utilizes transforms and provides a new coding scheme and codestream definition for images. Although JPEG 2000 is a decoding standard, and thus defines what a decoder must do, this definition restricts an encoder especially for lossless compression. Under the JPEG 2000 Standard, each image may be divided into rectangular tiles. If there is more than one tile, the tiling of the image creates tile-components. An image may have multiple components. For example, a color image might have red, green and blue components. Tile-components can be extracted or decoded independently of each other.

After tiling of an image, the tile-components are decomposed into one or more different decomposition levels using a wavelet transformation. These decomposition levels contain a number of subbands populated with coefficients that describe the horizontal and vertical spatial frequency characteristics of the original tile-components. The coefficients provide frequency information about a local area, rather than across the entire image. That is, a small number of coefficients completely describe a single sample. A decomposition level is related to the next decomposition level by a spatial factor of two, such that each successive decomposition level of the subbands has approximately half the horizontal resolution and half the vertical resolution of the previous decomposition level.

Although there are as many coefficients as there are samples, the information content tends to be concentrated in just a few coefficients. Through quantization, the numerical precision of a number of coefficients may be reduced with a disproportionately low introduction of distortion (quantization noise). Additional processing by an entropy coder reduces the number of bits required to represent these quantized coefficients, sometimes significantly compared to the original image.

The individual subbands of a tile-component are further divided into code-blocks. These code-blocks can be grouped into precincts. These rectangular arrays of coefficients can be extracted independently. The individual bit-planes of the coefficients in a code-block are entropy coded with three coding passes. Each of these coding passes collects contextual information about the bit-plane compressed image data.

The bit stream compressed image data created from these coding passes is grouped in layers. Layers are arbitrary groupings of successive coding passes from code-blocks. Although there is great flexibility in layering, the premise is that each successive layer contributes to a higher quality image. Code-blocks of subband coefficients at each resolution level are partitioned into rectangular areas called precincts.

Packets are a fundamental unit of the compressed codestream. A packet contains compressed image data from one layer of a precinct of one resolution level of one tile-component. These packets are placed in a defined order in the codestream.

The codestream relating to a tile, organized in packets, are arranged in one, or more, tile-parts. A tile-part header, comprised of a series of markers and marker segments, or tags, contains information about the various mechanisms and coding styles that are needed to locate, extract, decode, and reconstruct every tile-component. At the beginning of the entire codestream is a main header, comprised of markers and marker segments, that offers similar information as well as information about the original image.

The codestream is optionally wrapped in a file format that allows applications to interpret the meaning of, and other information about, the image. The file format may contain data besides the codestream.

The decoding of a JPEG 2000 codestream is performed by reversing the order of the encoding steps. FIG. 1 is a block diagram of the JPEG 2000 standard decoding scheme that operates on a compressed image data codestream. Referring to FIG. 1, a bitstream initially is received by data ordering block 101 that regroups layers and subband coefficients. Arithmetic coder 102 uses contextual information from previously coded coefficients provided by the bit modeling block 103 about the bit-plane compressed image data, and its internal state, to decode a compressed bit stream.

Next, the codestream is quantized by quantization block 104, which may be quantizing based on a region of interest (ROI) as indicated by ROI block 105. After quantization, an inverse wavelet/spatial transform is applied to the coefficients via transform block 107, followed by DC level shifting and optional component transform block 108. This results in generation of a reconstructed image.

SUMMARY OF THE INVENTION

A method and apparatus for generating multiple selectable contexts is described. In one embodiment, the method comprises generating two contexts, one of the two contexts for when the current bit being decoded is a zero bit and the other of the two context for when the current bit being decoded is a one bit indicating that a coefficient has become significant, selecting one of the two context to use to decode a bit subsequent to the current bit, wherein selecting the one context is based on the current bit once decoded, and decoding the bit subsequent to the current bit using the one context.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

FIG. 2A shows an example 8×8 code-block of coefficients with the sub-bit-plane pass identified for each coefficient and a label showing the order of processing for each coding pass.

FIG. 4 shows one embodiment of a significance memory organization for random access of a 16×16 code-block.

FIG. 15 is a block diagram of one embodiment of a "late context" MQ-decoder.

FIG. 16A illustrates how a comparison of probability class indices may operate.

FIG. 16B is a block diagram of a multiplexor that determines the MPS or LPS for each Qe_Value.

FIG. 18 illustrates one embodiment of an assignment of code blocks in parallel for 4:4:4 data.

FIG. 19 illustrates one embodiment of an assignment of code blocks in parallel for 4:2:2 data.

DETAILED DESCRIPTION OF THE PRESENT INVENTION

Figure 1:
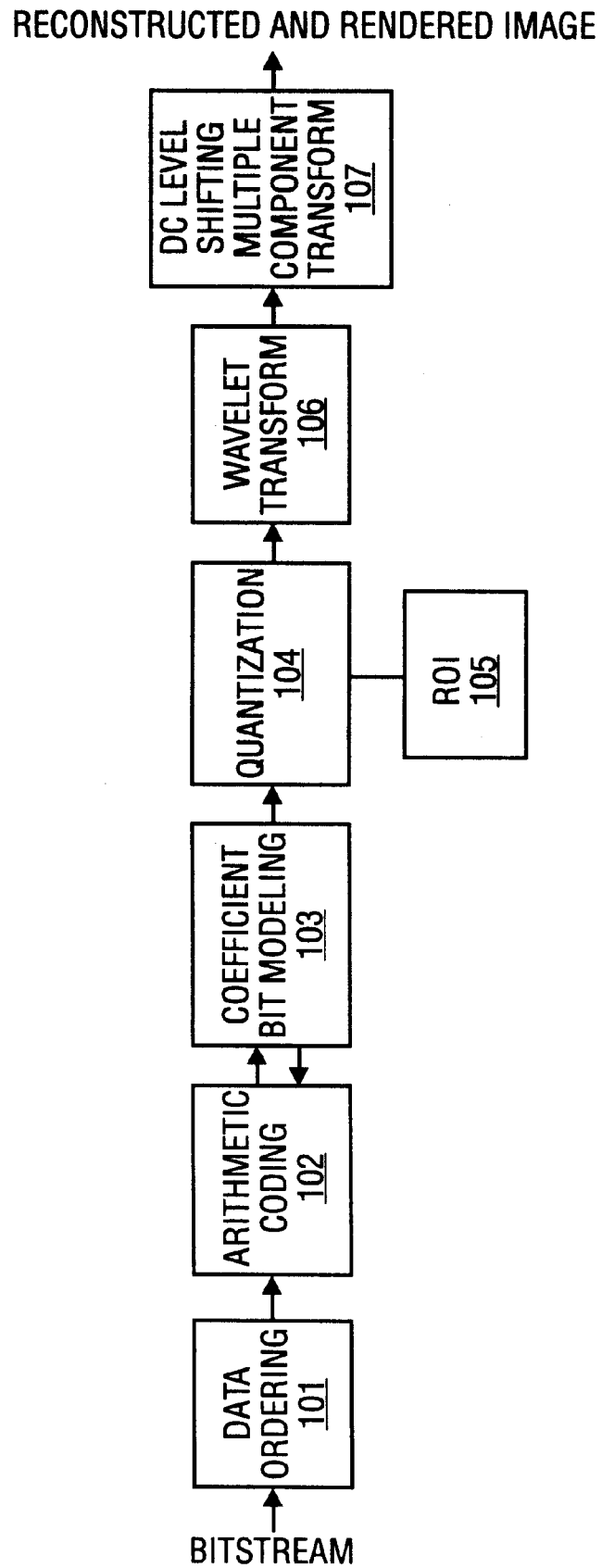
FIG. 1 is a block diagram of the JPEG 2000 standard decoding scheme.

Techniques for performing coding are described. These techniques may be used for implementing JPEG 2000 or for manipulating or adding to the feature set. That is, the JPEG2000 standard, Information Technology—JPEG 2000 image coding system: Core Coding System, ITU-T Rec. T.800 |ISO/IEC FDIS 15444-1: 2000 JPEG Image Coding System, incorporated herein by reference, leaves many choices to implementers. It is a purpose of the techniques described herein to use choices in JPEG 2000 to make high speed, low cost, low memory and/or feature rich implementations in software, hardware, and/or firmware.

In the following description, numerous details are set forth to provide a thorough understanding of the present invention. It will be apparent, however, to one skilled in the art, that the present invention may be practiced without these specific details. In other instances, well-known structures and devices are shown in block diagram form, rather than in detail, in order to avoid obscuring the present invention. Furthermore, any block, logic or functionality not described in detail may be implemented with well-known implementations or may be easily implemented by those skilled in the art using well-known hardware, software and/or firmware. Note that sometimes techniques and implementations are described using pseudo code. This is not meant to imply that the techniques are implemented solely in software; instead, such a description is often chosen to easily describe the functionality of terms one skilled in the art would easily understand.

Some portions of the detailed descriptions which follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

A machine-readable medium includes any mechanism for storing or transmitting information in a form readable by a machine (e.g., a computer). For example, a machine-readable medium includes read only memory ("ROM"); random access memory ("RAM"); magnetic disk storage media; optical storage media; flash memory devices; electrical, optical, acoustical or other form of propagated signals (e.g., carrier waves, infrared signals, digital signals, etc.); etc.

Overview

Figure 29:
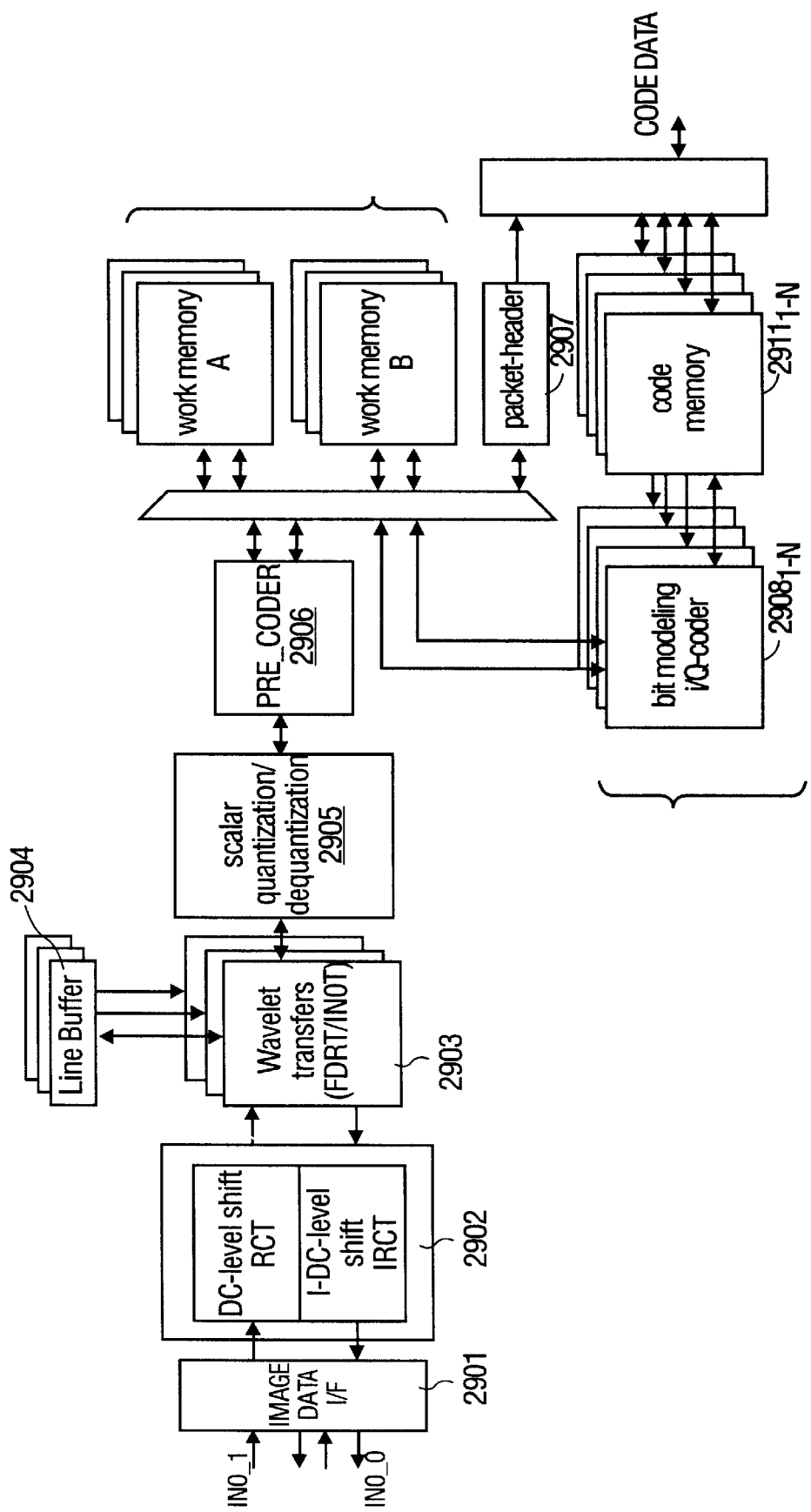
FIG. 29 is a block diagram of one embodiment of an encoder/decoder.

FIG. 29 is a block diagram of one embodiment of a coder. Referring to FIG. 29, a data interface 2901 is coupled to receive data to be encoded or output data after decoding. A DC level shifter 2902 is coupled to data interface 2901 to perform DC level shifting during encoding and decoding. Wavelet transform 2903 is coupled to a DC level shifter to perform forward or inverse wavelet transforms depending on the direction of flow. In one embodiment, wavelet transform 2903 performs a 5,3 reversible wavelet transform and a 5,3 irreversible wavelet transform to decompose an image into two to five levels of decomposition. Line buffers 2904 are coupled to wavelet transform 2903 to provide memory to support wavelet transform 2903 when performing the wavelet transform.

A scaler quantization/dequantization block 2905 is coupled to wavelet transform. 2903 to perform scaler quantization. In one embodiment, scaler quantization is only used for the 5,3 irreversible wavelet transform. A precoder 2906 is coupled to scaler quantizer to perform precoding. In one embodiment, the precoding converts coefficients from two's complement to sign magnitude (or vice versa for decoding). The preceding also determines zero bitplanes. Work memory A and work memory B are coupled to precoder 2906 along with packet header processing 2907. The interface to work memory A and B and packet header 2907 is also coupled to bit modeling MQ-coders $2908_{1-N}$. Each of the MQ-coders $2908_{1-N}$ is coupled to individual code memory $2911_N$ to store coded data (compressed data in JPEG 2000 terminology). The coded data from code memory and the packet header from packet header 2907 is output as coded data. This is a JPEG 2000 bitstream. An additional functional block (not shown) may be used to create/read the main and tile-part headers. The bitstream and the headers make a JPEG 2000 codestream.

Context Model Data Structure with Skipping for Sub-bit-planes

In JPEG 2000, for bit-planes of coefficients that are not initially all-zero bit-planes (starting with the most significant bit (MSB) down), each coefficient is coded in one of three sub-bit-plane passes: significance propagation, refinement, and cleanup. FIG. 2A shows an example 8×8 code-block with the sub-bit-plane pass identified for one bit-plane for each coefficient. Referring to FIG. 2A, SP refers to the significance propagation pass, R refers to refinement pass, and C refers to the cleanup pass. The indices from 0 to 63 in FIG. 2A show the code block scan order. Thus, the scanning order is down four coefficents and then back up to the top row, respectively continuing across the code-block. Once scanning has completed across the code-block, scanning continues at the fifth coefficient of each column down across rest of the code-block.

A typical implementation might read the entire block of coefficients 3 times, once for each coding pass of a bit-plane. This technique describes a way to read the entire block of coefficients for the significance propagation pass of each bit-plane, but to read only those coefficients actually needed for the refinement and cleanup passes.

On the left side of each cell in FIG. 2A, solid lines indicate coefficients in the refinement sub-bit-plane pass and dotted lines indicate coefficients that are skipped in the refinement sub-bit-plane pass. Solid lines on the right side of each cell in FIG. 2A are similar for the cleanup sub-bit-plane pass. Once the pass has been identified for each coefficient, then the coefficients may be processed.

Data structures may be built during the significance propagation pass using a process described below. The data structures may be used by the context model to reduce the number of accesses to the memory. Using the data structures, instead of checking each cell to determine what pass the information is in and then having to skip them, the context model need only access the memory once. Furthermore, the data structures allow access to multiple locations at the same time, such as when cleanup bits are coded 4 at a time.

Tables 1 and 2 show data structures that describe the locations of coefficients in the refinement and cleanup sub-bit-plane passes (respectively). For each index, there is a run count of the number of coefficients in the sub-bit-plane pass and a skip count of the number of following coefficients that are in a different pass. These data structures allow these sub-bit-plane passes to be coded efficiently by allowing coefficients in other passes to be skipped.

TABLE 1

Data structure for refinement bits

| index | run | skip |
|-------|-----|------|
| 0 | 0 | 1 |
| 1 | 2 | 8 |
| 2 | 1 | 3 |
| 3 | 1 | 48 |

TABLE 2

Data structure for cleanup bits

| index | run | skip |
|-------|-----|------|
| 0 | 0 | 8 |
| 1 | 2 | 2 |
| 2 | 2 | 2 |
| 3 | 2 | 2 |
| 4 | 16 | 1 |
| 5 | 3 | 1 |
| 6 | 3 | 1 |
| 7 | 3 | 1 |
| 8 | 15 | 0 |

The process is performed by processing logic that may comprise hardware, software, or a combination of both. In one embodiment, the processing logic that creats the data structures and uses them is located in bit modeling MQ-coders $2908_{1-N}$ of FIG. 29. During the process, to create these data structures, the datastructures are first initialized.

```
ri = 0           // index for refinement
ci = 0           // index for cleanup
r_run[ri] = 0    // run count for refinement
r_skip[ri] = 0   // skip count for refinement
c_run[ci] = 0    // run count for cleanup
c_skip[ci] = 0   // skip count for cleanup
state = INITIAL  // state can be INITIAL, SIG_PROP, REFINE or
                 CLEANUP
```

The "state" variable is used to distinguish between the start and the middle of a run. The "state" variable indicates the coding pass for the previous coefficient. If the current coefficient is the same, the size of a run or skip will be increased; if it is different, a new run will be started. Then each coefficient in the code-block is considered in the code block scan order in order to generate the seperate counts.

```
For-y1=0 to maximum-for-y1 step 4
    for x=0 to maximum-for-x step 1
        for y2=0 to maximum-for-y2 step 1
            process coefficient [x,y1+y2]
```

In the above, the maximum for y1 is the greatest integer multiple of 4 that is less than the height of the code-block ("(height−1) & ~3"). The maximum for x is "width-1" for the code-block. The maximum for y2 is the smaller of 3 or "height-y1-1". One embodiment of a procedure for processing each coefficient is:

```
if coefficient was significant in previous bitplane then
    if state is not REFINE then
        ri=ri+1
        r_run[ri]=1
        r_skip[ri]=0
        state=REFINE
    else
        r_run[ri]32 r_run[ri]+1
    c_skip[ci]=c_skip[ci]+1
else if a neighbor of the coefficient is significant then
    (coefficient is predicted sigificant, code it)
    r_skip[ri]=r_skip[ri]+1
    c_skip[ci]=c_skip[ci]+1
    state=SIG_PROP
else
    if state is not CLEANUP then
        ci=ci+1
        c_run[ci]=1
        c_skip[ci]=0
        state=CLEANUP
    else
        c_run[ci]=c_run[ci]+1
    r_skip[ri]=r_skip[ri]+1
```

The result of applying the procedure is that all the coefficients in the significance propagation pass will be coded while the data structures for the refinement bits and clean up bits are created.

If desired, the run counts can be prevented from wrapping around lines. One embodiment of a process to prevent wrapping around lines is described below in the following psuedo-code. This may allow for handling boundaries more easily.

```
for y1=0 to maximum for y1 step 4
    for x=0 to maximum for x step 1
        for y2=0 to maximum for y2 step 1
            process coefficient [x,y1+y2]
    if state is REFINE then
        n=ri+1
        r_run[ri]=0
        r_skip[ri]=0
        state=INMAL
    else if state is CLEANUP then
        ci=ci+1
        c_run[ci]=0
``` c_skip[ci]=0
state=INITIAL

For software, storing run and skip values as integers (in 32-bits for 32-bit computers, etc.) is most convenient. The worst case is runs of length one, with a zero length run at the start. In JPEG 2000, code-blocks are limited to a maximum of 4096 coefficents. Also the width and height of code-blocks are limited to a maximum of 1024 coefficients. For any size code-block with 4096 total coefficients with run counts continuing across groups of lines, 4097 memory locations is the maximum number of memory locations for the memory size. For 64×64 code-blocks with run counts starting every group of four lines, (4×64+1)×(64/4)=4112 memory locations is the maximum. For 1024×4 code-blocks with run counts starting every group of four lines (4×4+1)×(1024/4)=4352 memory locations is the maximum.

In hardware to save memory, a minimal but fixed number of bits can be used for run and skip counts. If an indication of whether the first count is a run or skip is signaled (e.g., one bit signal indication), then run counts will be greater than 1 (and the ability to code 0 is not needed). For any size code-block with 4096 total coefficients with run counts continuing across groups of lines, one bit may be used to signal whether the first count is a run or skip and 4096×12 bits for counts for a total of 49,153 bits. For 64×64 code-blocks with run counts starting every group of four lines, one bit may be used to signal whether the first count is a run or skip for each group of four lines. Thus, a number of bits would be 1×64/4+4096×12=49,168 bits. For 1024×4 code-blocks with run counts starting every group of four lines, the number of bits would be 1×1024/4+4096×12=49,408 bits.

One embodiment of a variable length code can be used to represent counts. Table 3 shows an example where small counts are represented with a small number of bits (e.g., 3 bits) and large counts are represented with a larger number of bits (e.g., 13 bits). The goal of such an approach is to have most counts be either 1, 2, 3, or 4 so that the smaller codewords are used more frequently. Only two sizes are used to make the implementation simple. However, more than two sizes could be used with added complexity.

TABLE 3

An Example of Simple Variable Length Code for Counts

| count | codeword |
|---|---|
| 1 | 000 |
| 2 | 001 |
| 3 | 010 |
| 4 | 011 |
| 5 | 1000000000000 |
| 6 | 1000000000001 |
| . | . |
| . | . |
| . | . |
| 4096 | 1111111111011 |

For this code, the worst case is when all run lengths are 1 (every codeqoes is 3 bits). For three cases (counts go across lines, 64×64 code blocks with groups of four lines, 1024×4 code-blocks with groups of four lines), the total number of bits are 12,289 bits; 12,304 bits; and 12,544 bits, respectively.

Reduced memory usage can be achieved with a more complicated variable length code. A good structured code is a gamma code, $\gamma^1$ or $\gamma$ (from Appendix A of Bell, Cleary, Whitten "Text Compression", Prenice Hall, N.J. 1990.) as shown in Table 4.

TABLE 4

Structured Variable Length Code for Counts

| count | codeword ($\gamma^1$ format) | codeword ($\gamma$ format) |
|---|---|---|
| 1 | 0 | 0 |
| 2 | 10_0 | 100 |
| 3 | 10_1 | 110 |
| 4 | 110_00 | 10100 |
| 5 | 110_01 | 10110 |
| 6 | 110_10 | 11100 |
| 7 | 110_11 | 11110 |
| 8 | 1110_000 | 1010100 |
| 9 | 1110_001 | 1010110 |
| ... | ... | ... |
| 15 | 1110_111 | 1111110 |
| 16 | 11110_0000 | 101010100 |
| 32 | 111110_00000 | 10101010100 |
| 64 | 111110_000000 | 1010101010100 |
| 128 | 1111110_0000000 | 101010101010100 |
| 256 | 111111110_00000000 | 10101010101010100 |
| 512 | 1111111110_000000000 | 1010101010101010100 |
| 1024 | 11111111110_0000000000 | 101010101010101010100 |
| 2048 | 111111111110_00000000000 | 10101010101010101010100 |
| 4096 | 1111111111110_000000000000 | 1010101010101010101010100 |

Note that $\gamma^1$ and $\gamma$ only differ in how the bits in the codeword are arranged. The "_" in $\gamma^1$ codewords is not part of the codeword, it is just to make them easier to read by separating the prefix from the counter. The worst case is for counts of 2 which requires 3 bits. For the three cases (counts go across lines, 64×64 code-blocks with groups of 4 lines, and 1024×4 code-blocks with groups of four lines), the total number of bits are 6,145 bits; 6,160 bits; and 6,400 bits, are required, respectively.

Table 5 is one embodiment of a code for counts 1 . . . 4096 where the longest codeword is 16-bits. Counts of 1, 2, 3, 4 or 5 are represented with 1, 2, 4, 5 and 5 bits respectively. Counts of 6 . . . 21 are represented with 8 bits. Counts of 22 . . . 4096 are represented with 16-bits. Counts of 3 and 6 are the worst case. For the three cases (counts go across lines, 64×64 code-blocks with groups of 4 lines, and 1024×4 code-blocks with groups of 4 lines), the total number of bits are 5,463 bits; 5,478 bits; and 5,718 bits.

TABLE 5

Optimal Variable Length Code for Counts

| count | codeword |
|---|---|
| 1 | 0 |
| 2 | 01 |
| 3 | 1100 |
| 4 | 1101_0 |
| 5 | 1101_1 |
| 6 | 1110_0000 |
| 7 | 1110_0001 |
| . | . |
| . | . |
| . | . |
| 21 | 1110_1111 |
| 22 | 1111_0000_0000_0000 |
| 23 | 1111_0000_0000_0001 |
| . | . |
| . | . |
| . | . |
| 4096 | 1111_1111_1110_1010 |

Figure 30:
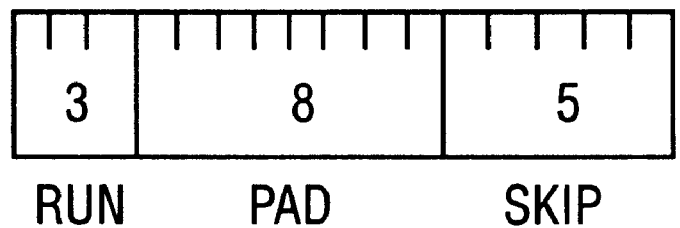
FIG. 30 illustrates an example of a 16 bit word having both run counts and skip counts.

If using variable length codes with hardware, accessing both a run count and skip count during the same clock cycle may be desirable. In one embodiment, the memory is larger than the minimum size by one word (e.g., 16 bits) so that flushing is simple. For example, with 16 bit words, run counts use 163 bits. Therefore, the last word uses only 3 bits. This requires padding with 13 bits to complete a word. Skip counts use 85 bits. Therefore, the last word uses only 5 bits. This requires padding with 11 bits to complete a word. If $$\text{memorysize} \geq \left(\frac{163+13}{16} + \frac{85+11}{16}\right)$$

or 17, padding of run and skip counts can be independent. If the sizes is 16, there is one word with both run counts and skip counts, with padding in between. FIG. 30 illustrates an example of a 16 bit word having both run counts and skip counts.

Figure 2B:
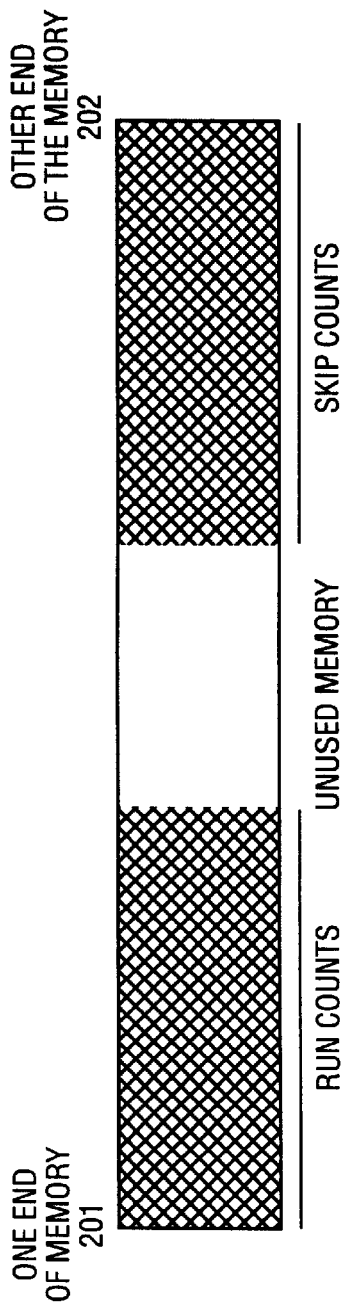
FIG. 2B illustrates a memory for a variable length run and skip counts.

FIG. 2B illustrates a memory for a variable length run and skip counts. This memory structure. allows starting a run count from one side (201) of memory and skip counts from the other side (202) of memory. One side 201 of memory may be the beginning or the end, with the other side (202) being the end or beginning, respectively. This allows for simultaneously decoding a run count and a skip count in parallel because the start of both 1 run and 1 skip variable word is known at the same time, instead of decoding a run count first, determining its length, and then decoding a skip count. If they were serial (run-skip-run, etc.), one at a time would be known (as one would have to be decoded to find the other).

Note that separate skip count and run count decoders may be used to decode the information in the memory shown in FIG. 2B. Alternatively, a single decoder could be shared by both.

Hardware for Context Model

The context model may be implemented in hardware. In hardware, one goal is to generate the next context as soon as possible so the MQ coder is not idle.

Memory Organization

Figure 3:
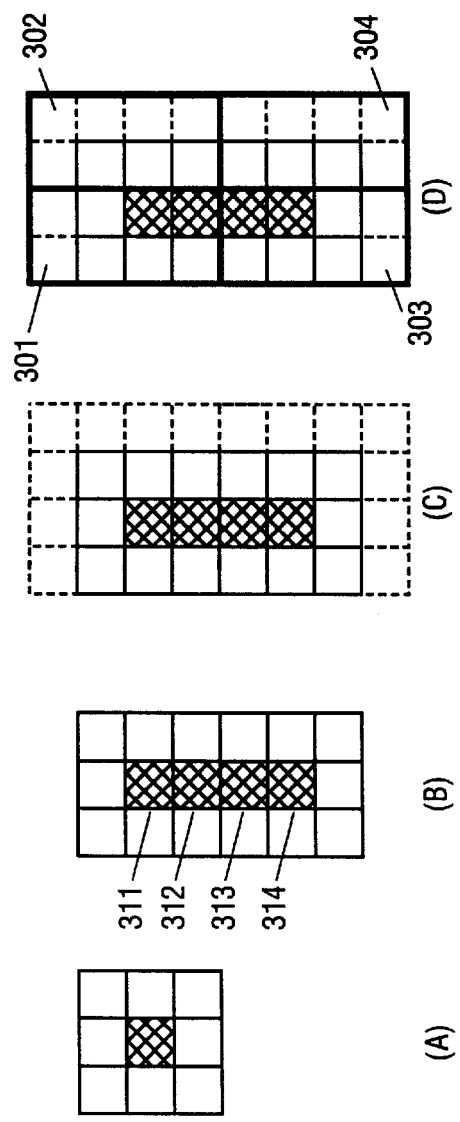
FIGS. 3A–D illustrate neighborhood coefficients and memory organization for one embodiment of a context model.

FIGS. 3A–D illustrate the neighborhood coefficients and memory organization for embodiments of a context model. The context model for individual coefficients is at most based on a 3×3 neighborhood as shown in FIG. 3A. In one embodiment, four bits are handled at the same time. In such a case, the context model for groups of four coefficients 311–314 is at most based on a 3×6 neighborhood as shown in FIG. 3B. It is often preferable for memory accesses to hardware to be dealing with data grouped in powers of two. Therefore, the region that is based on a power of two that would contain the 3×6 region is a 4×8 region. FIG. 3C illustrates a 3×6 neighborhood being a subset of a 4×8 region of coefficients. Access to the entire 4×8 region of FIG. 3C may be performed as separate accesses that may or may not be to the same memory. FIG. 3D illustrates a 4×8 region that is divided into four 2×4 regions 301–304 which are each stored in a different memories for parallel, random access. This memory structure allows everything needed to determine contents from a group of coefficients to be read from memory at once, instead of sequentially. That is, the entire 4×8 block of coefficient information may be accessed at once.

Figure 4:
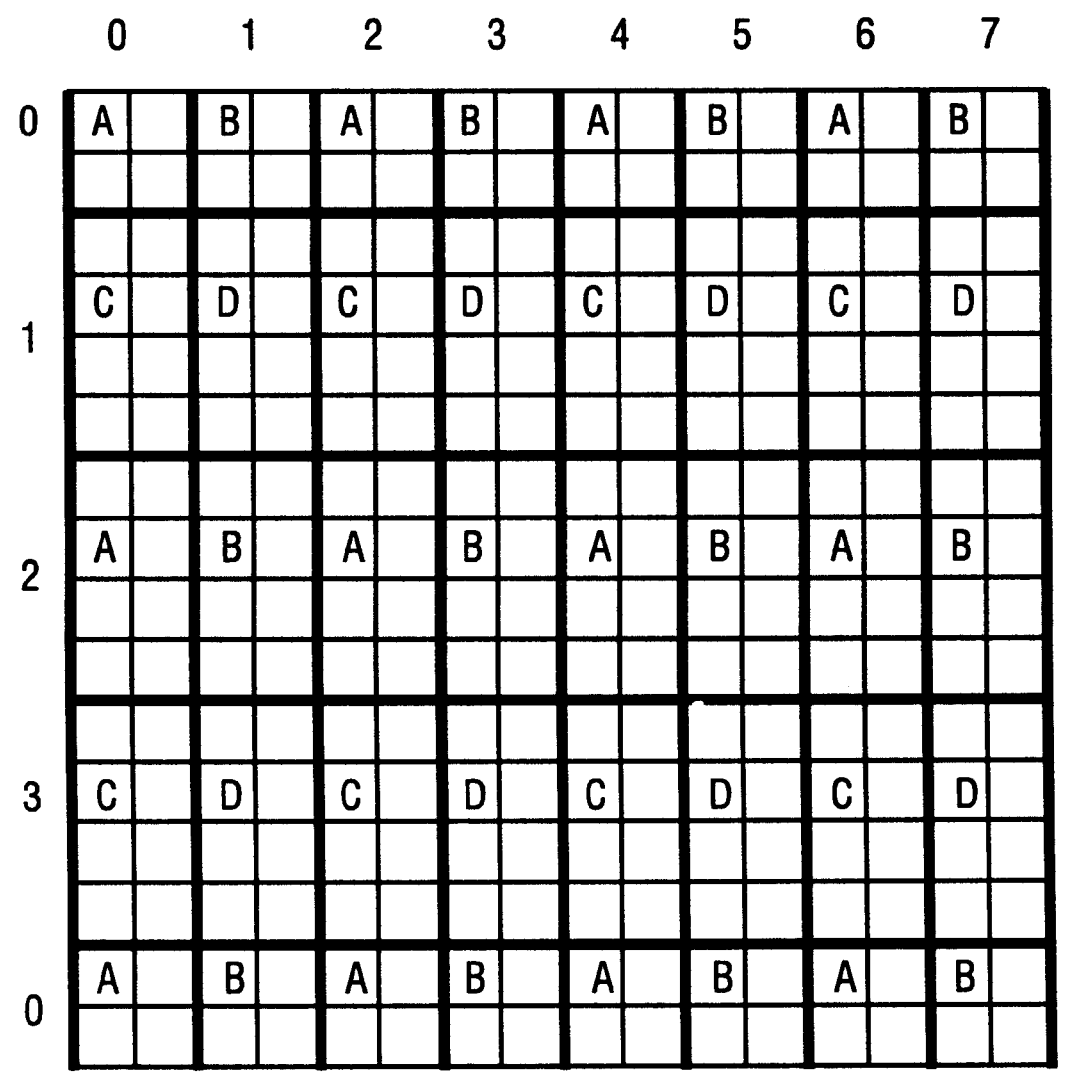

FIG. 4 shows one embodiment of the significance memory organization for random access for a 16×16 code-block. One implementation may handle other sizes, including, but not limited to, 32×32 and 64×64. Referring to FIG. 4, each coefficient has been assigned to one of four memories (A, B, C or D). Certain groups (two rows along the top and two rows along the bottom) are half the size of the other groups. This is because in FIG. 3D, the top two rows are outside of the code-block (off the edge) for the first row of code-blocks. There is a similar boundary condition of the bottom of the code-blocks.

In one embodiment, these memories store one bit per coefficient for significance state (8 bits total per address). In an alternative embodiment, these memories store two bits per coefficient for significance state and sign (16 bits total per address). In still another embodiment, these memories store the entire coefficient (8N bits if N is the size of one coefficient). In an alternative embodiment, if the entire coefficient is not stored in these memories, an additional single memory with one address per coefficient may be used.

The following Verilog code is one embodiment of a procedure to convert two 6-bit address inputs ("x" and "y") from control logic in the context model (for the 64×64 code-blocks) into a 7-bit address output to memory ("addr") and a 2-bit "bank" select to indicate memory "A", "B" "C" or "D".

module makeAddress(x, y, addr, bank);
    input [5:0]x; /*x has bits 5 . . . 0, where 5 is MSB
      input [5:0]y;
      output [6:0]addr;
      output [1:0]bank;
      wire [5:0]yp2;
      assign yp2=y+2;
      assign addr={yp2[5:3], x[5:2]};
      assign bank={yp2[2], x[1]};
  endmodle The first assign statement above sets the offset for the boundary. In other words, the offset "assign yp2=y+2" is used for proper alignment of groups of four as shown in FIG. 4. The second assign statement above sets the address to bits 5 . . . 3 of the input y plus the offset concatenated with bits 5 . . . 2 of input x as the lower portion of the number. The third assign statement above sets the bank equal to the bit 2 of the input y plus the offset concatenated with bit 1 of input x.

Significance Propagation Pass

Figure 5:
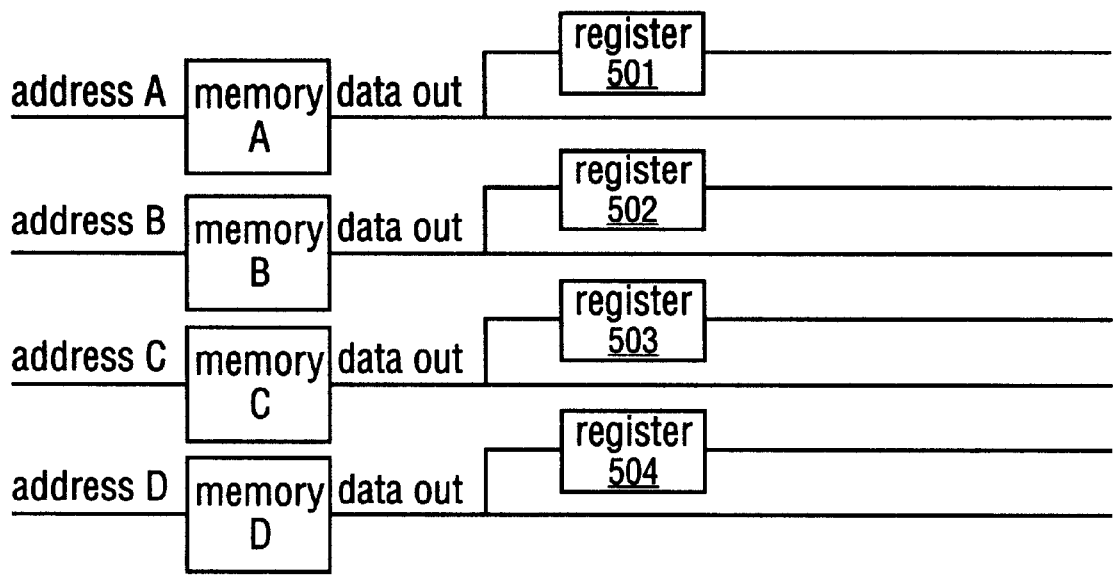
FIG. 5 shows the memories and registers used in the significance propagation pass for random access.

FIG. 5 shows one embodiment of the memories and registers used in the significance propagation pass for random access. Referring to FIG. 5, address A is input to memory A to produce data output, which is also stored in register 501. In response to address B, memory B outputs data which is also stored in register 502. Similarly, memory C outputs data in response to address C, where the output is also stored in register 503. Lastly, memory D outputs data in response to address D and also stores the data in register 504. In one embodiment, the outputs of each of the memories A–D is a 2×4 region which together create a 4×8 region (e.g., region 601 of FIG. 6).

All of the outputs of the memories and registers in FIG. 5 together provide a 6×6 region of significance bits. Note this could be significance state and sign or the actual coefficients in alternative embodiments. In other words, the data being used out of the memories A–D in parallel is combined with the data read outs from the memories A–D in the previous cycle that had been stored in registers 501–504. This region of significance bits plus feedback from the context model is enough to determine in which pass a 4×4 region of coefficients is.

Figure 6:
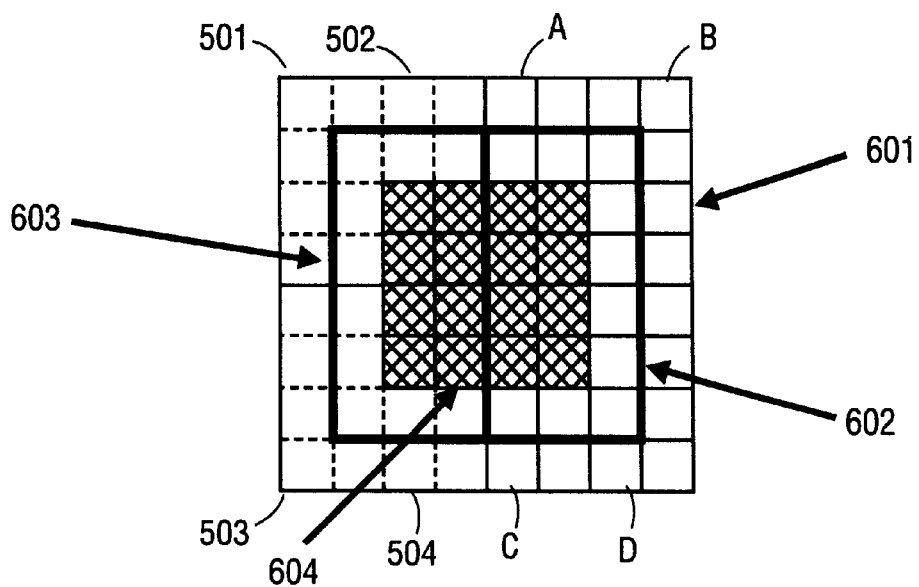
FIG. 6 illustrates the significance state from memory and stored in registers for random access.

FIG. 6 illustrates the significance state from memory and stored in registers for random access. Referring to FIG. 6, region 601 illustrates a 4×8 region that is read from memory. Region 602 illustrates a 3×6 region that is read from memories A–D and is used for context modeling. Region 603 illustrates a 3×6 region that is stored in registers 501–504 and is used in context modeling. Region 604 illustrates a 4×4 region of coefficients that are being processed. FIG. 6 also shows exemplary 2×4 portions of the 8×8 block that may come from memory locations of memories A–D and registers 501–504.

One embodiment of address generation logic for the significance propagation pass is set forth in the following pseudo code. Note that the addressing is not dependent on the data, and zero data is provided at boundaries.

```
address_A_y=0
address_B_y=0
address_C_y=0
address_D_y=0
for y=0 to 60 step 4
    address_A_x=0
    address_C_x=0
    read memory A (will be registered next)
    read memory C (will be registered next)
    assert clear for memory B register (will be cleared next)
    assert clear for memory D register (will be cleared next)
    for x=0 to 60 step 4
        address_A_x=x+4
        address_B_x=x
        address_C_x=x+4
        address_D_x=x
        if x<60 then
            read memory A (will be registered next)
            read memory C (will be registered next)
        else
            use "all bits zero" for memory A output
            use "all bits zero" for memory B output
        read memory B(will be registered next)
        read memory D(will be registered next)
        process 4x4 block of coeffcients x . . . x+3, y . . . y+3
    if y AND 4==0
        address_A_y=address_A_y+8
        address_B_y=address_B_y+8
    else
        address_C_y=address_C_y+8
        address_D_y=address_D_y+8
```

For processing 4×4 blocks, runs of bits in the same pass may be handled together. If there are N coefficients in a row in the refinement pass, the following pseudo code can be used to process them:

```
if state is not REFINE then
    ri=ri+1
    r_run[ri]=N
    r_skip[ri]=0
    state=REFINE
else
    r_run[ri]=r_run[ri]+N
```

Note that this code is similar to the code described above except "N" has replaced 1 to signify that N coefficients are being processed instead of 1.

If there are N coefficients in a row in the cleanup pass, the following pseudo code depicts one embodiment of a process for processing coefficients:

```
if state is not CLEANUP then
    ci=ci+1
    c_run[ci]=N
    c_skip[ci]=0
    state=CLEANUP
else
    c_run[ci]=c_run[ci]+N
```

Figures 7, 8:
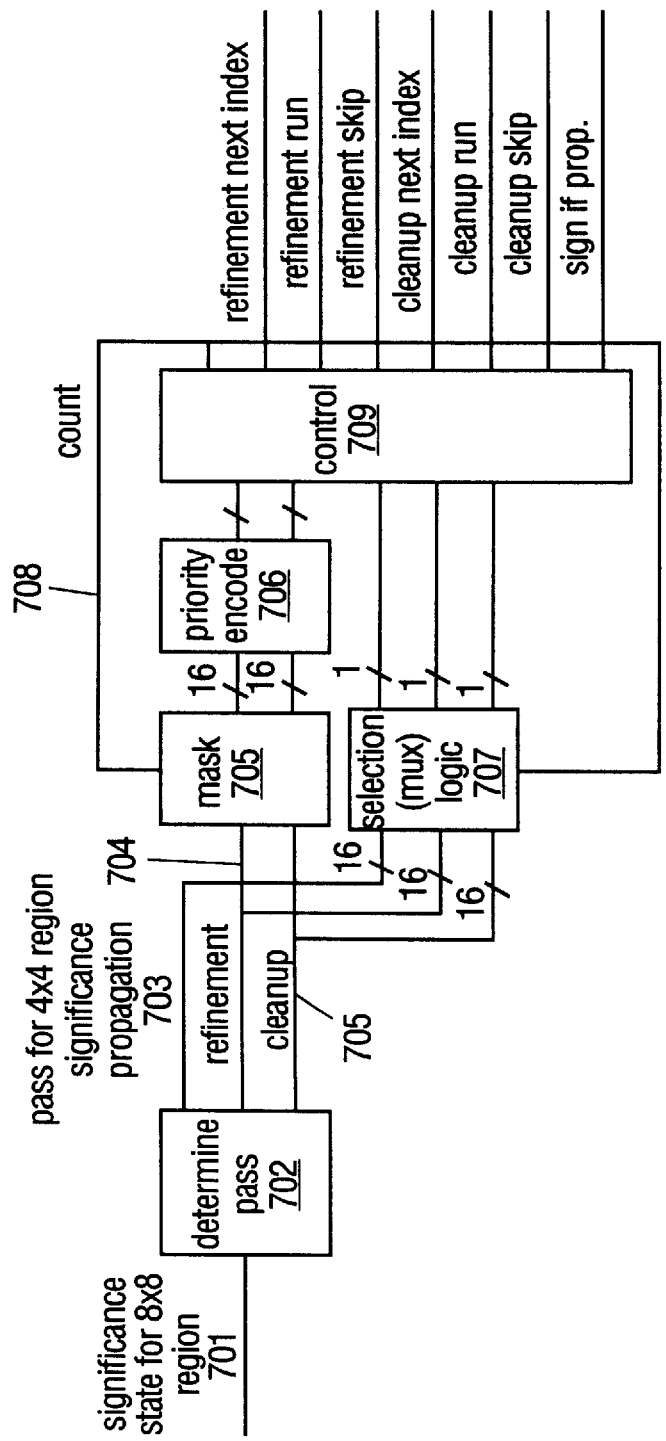
FIG. 7 is a block diagram of one embodiment of significance propagation pass logic.
FIG. 8 illustrates an example of performance of one embodiment of a context model on a 4×4 block.

FIG. 7 is a block diagram of one embodiment of significance propagation pass logic. In one embodiment, this logic is in bit modeling MQ-coders $2908_{1-N}$ of FIG. 29. The pass for each coefficient is for a 4×4 region represented as three bits per coefficient: significance propagation or other, refinement or other, and cleanup or other. By controlling the access operation of the memory A–D in FIG. 5, a 4×4 block is retrieved from memory and the significance propagation pass is performed. Looking at each 4×4 block, the runs in the various passes are identified and any coefficient in the significance pass is to be coded, while runs and skip counts for the refinement and clean up passes are identified for processing one run at a time. When the previous bit in the block (via the scan order) (or a previous codeblock if starting a new codeblock) is a significance propagation bit and the current state is not significance propagation, a new run is started. In such a case, the index is incremented in the table storing run and skip counts (e.g., set skip to zero, set run to the first value). Both tables of run and skip counts are incremented in this manner while processing the 4×4 block. If the previous bit in the 4×4 block was in the refinement or cleanup passes and more such data follows, then the count of the current run is incremented. Other sized regions may be used, including, for example, a 4×N region, where N is a power of two.

Figure 31:
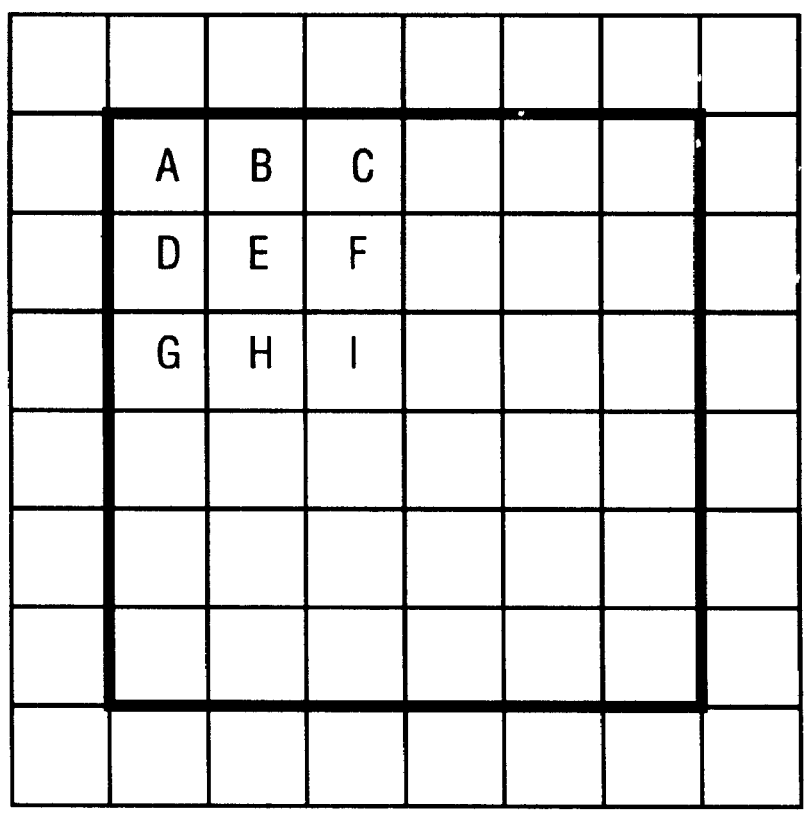
FIG. 31 illustrates an exemplary 8×8 region of significance state bits for determining the coding pass.
Figure 32:
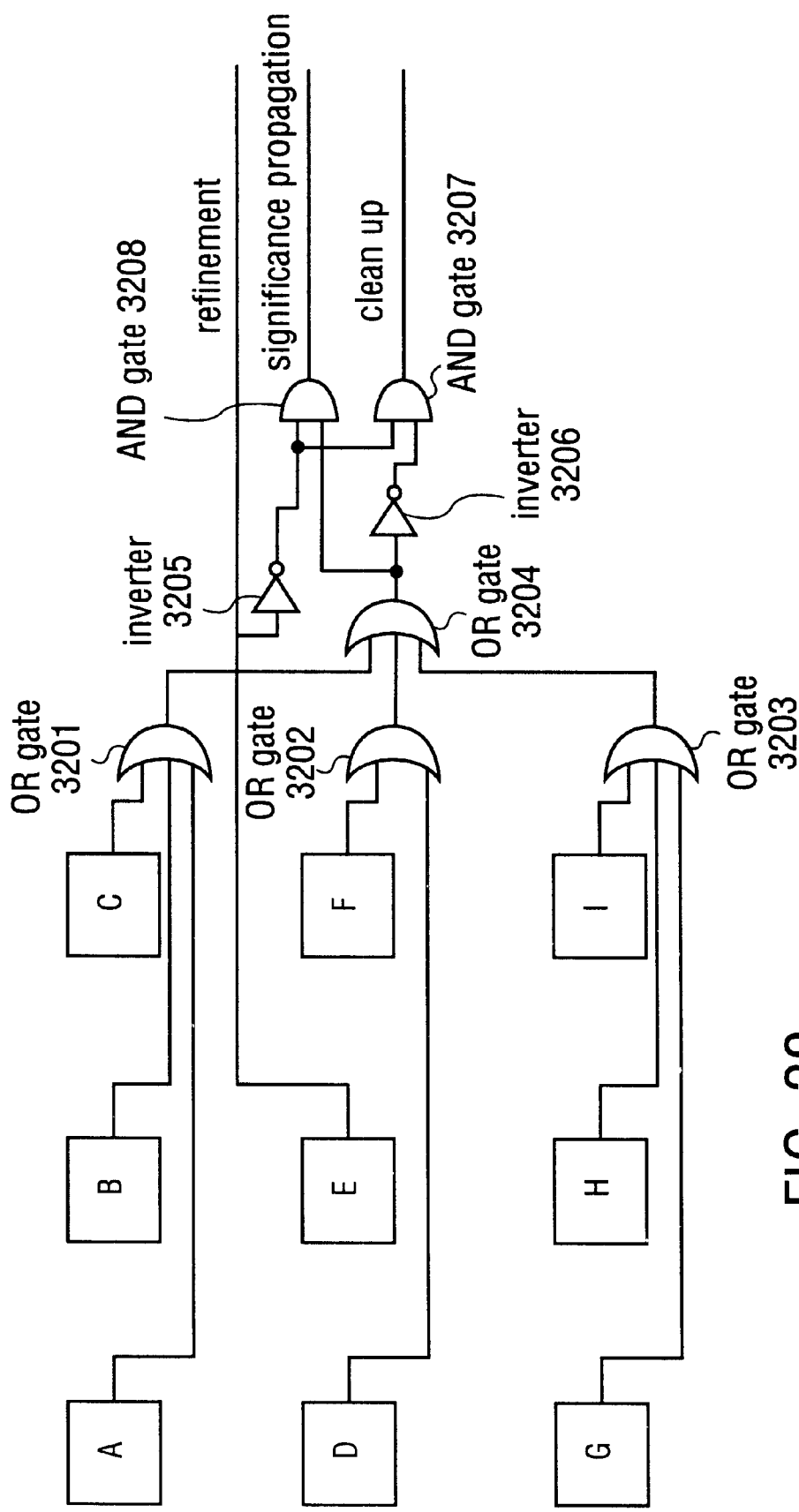
FIG. 32 is a diagram of one embodiment of determine pass logic.

Referring to FIG. 7, a significant state 701 for an 8×8 region is input to logic 702 which determines the pass. FIG. 31 illustrates an exemplary 8×8 region. The significance state 701 may comprise information that indicates, for example, there are N coefficients in a row in a refinement pass. Such information may be accessed from a table, as described above. Determine pass logic 702 looks at the 16 3×3 regions in the center 6×6 region of the 8×8 region. Coefficients A . . . I represent the first 3×3 region. FIG. 32 is a diagram of one embodiment of determine pass logic 702. The logic in FIG. 32 is replicated 16 times, one for each coefficient in the 4×4 block. Note that the regions may be other than 3×3 regions and the number of regions processed may be greater than or less than 16 at a time.

Referring to FIG. 32, all bits of coefficients A–C are input to OR gate 3201. All bits of coefficients D and F are coupled to inputs of OR gate 3202. All bits of coefficients G–I are coupled to inputs of OR gate 3203. The outputs of OR gates 3201–3203 are coupled to inputs of OR gate 3204. The output of OR gate 3204 is coupled to an input of inverter 3206 and an input of AND gate 3208. Coefficient E represents the 16 bit output of refinement signals 704 and is coupled to an input of inverter 3205, the output of which is coupled to the other input of AND gate 3208 and an input of AND gate 3207. The output of AND gate 3208 is the significance propagation signals 703. The output of inverter 3206 is coupled to the other input of AND gate 3207. The output of AND gate 3207 is the cleanup signals 705.

In operation, if any of the significance state bits E are 0, then the output of AND gates 3208 corresponding to those bit positions, and thus, the significance propagation signals 704, are going to be 1's if the significance state is 1 for any of coefficients A–D or F–I. Similarly, if any of the significance state bits E are 0, then the output of AND gate 3207 corresponding those bit positions, and thus the cleanup signals 705, are going to be 1's if the significance state bits are all zero for coefficients A–D or F–I.

As a result of the determination, logic 702 asserts either significant propagation signals 703, refinement pass signals 704, or clean up pass signals 705. In one embodiment, each of signals 703–705 is 16 bits wide. For each corresponding bit in signals 703, 704, and 705, only one bit may be 1 and 2 must be 0. Thus, there are three possibilities at 16 locations. Each of the outputs of logic 702 is coupled to one input of selection logic (e.g., multiplexer (MUX)) 707.

Selection logic 707 generates three pass bits for the current coefficient indicating the pass for the current coefficient and sends the pass bits to control logic 709. Only one of these pass bits is asserted in response to count signal 708 output from control 709. Count signal 708 indicates which of the 16 coefficients in the 4×4 block is currently by processed. When handling refinement bit runs and cleanup bit runs, count signal 708 may be incremented by a number greater than one. Thus, of the 16 bits in each of the outputs of determine pass logic 702, the bit in each of the three outputs corresponding to that coefficient is output.

The refinement pass signals 704 and clean up pass signals 705 are input to mask 705 with feedback count signal 708. Count signal 708 is the current coefficient position in the 4×4 region, e.g., 0 . . . 15. In response to these inputs, mask 705 masks what has already been done, as indicated by count 708, including only coefficients that are not being coded yet. For example, if three coefficients have already been processed, mask 705 masks the three signal lines of each of the refinement and cleanup outputs (704 and 705).

Mask 705 also generates 2 outputs to priority encoder 706 representing signal 704 and 705 with certain signals masked to one (in one embodiment). These outputs of mask 705 are masked refinement and masked cleanup indications (e.g., signals).

In response to the two inputs, priority encoder 706 finds the next non-refinement bit (or coefficient) and the next non-cleanup bit for the significance propagation pass and inputs these to control logic 709. In one embodiment, priority encoder 706 is a zero-finding priority encoder. In so doing, priority encoder 706 converts the current position of the bit (or coefficient) in the codeblock into a count of leading zeros. In one embodiment, this is performed using a truth table such as

| Input | Output |
|---|---|
| 1 x x x x x | 0 |
| 0 1 x x x x | 1 |
| 0 0 1 x x x | 2 |
| . | . |
| . | . |

Mask 705, priority encoder 706, and selection logic 707 may comprise a processing unit that receives outputs from determine pass unit 702 and generates outputs indicating the next non-refinement coefficient and next non-cleanup coefficient and the pass for the current coefficient.

In response to its inputs, control logic 709 generates a refinement next index, a refinement run indication, a refinement skip indication, a cleanup next index, a cleanup run indication, a cleanup skip indication, and a significant propagation indication. The inputs to control logic are:
   next non-refinement bit position "R"
   next non-cleanup bit position "C"
If R>count then
   refinement run=R-count
   refinement skip=0
   clean-up run=0
   clean-up skip=R-count
   refinement next index=1
   cleanup next index=0
   signif prop=0
Else if C>count
   refinement run=0
   refinement skip=C-count
   clean-up run=C-count
   clean-up skip=0
   refinement next index=0
   clean-up next index=1
   signif prop=0
else
   refinement run=0
   refinement skip=1
   clean-up run=0
   clean-up skip=1
   refinement next index=0
   clean-up next index=0
   signif prop=1

The following pseudo code describes the operation of the significance propagation pass logic described in FIG. 7.
   count=0
   while (count<16)
      mask=(1<<count)−1
      refinement_masked=refinement |mask
      use priority encoder to find next non-refinement bit
      cleanup_mask=clean up |mask
      use priority encoder to find next non-cleanup bit
      if current bit is in significance propagation pass
         process coefficient as significance propagation
         count=count+1
      else if current bit in refinement pass
         N="next non-refinement bit"-count
         process N bits as refinement pass
         count=count+N
      else
         N="next non-cleanup bit"-count
         process N bits as cleanup pass
         count=count+N Note that the significance states are updated from the MQ decoder (and MQ encoder or coefficient values when encoding) anytime a "1" coefficient is coded in the significance propagation pass.

Assuming the context model operates in one clock cycle and the MQ coder operates in one clock cycle, two clock cycles are required when there is feedback. FIG. 8 illustrates an example of performance on a 4×4 block, illustrating the potentially worst case scenario. Eight context models and MQ coders operating in parallel at twice the component clock rate should be able to decode 7 bitplanes per coefficient (8×2/2.25≈7). Without skipping in the significance propagation pass, the worst case performance reduces to at most 5.5 bitplanes per coefficient. Without skipping in any pass, the worst case performance reduces to at most 4 bitplanes per coefficient.

Significance Propagation Pass Skipping in Software

In software, parallel access from many memories is impractical. Instead, in one embodiment, the code-block is divided into 4×4 groups of coefficients. For each group, a count is maintained of the number of bits that are significant. In such a case, the maximum memory required is 256×5 bits. Blocks of coefficients that are all in the refinement pass have a count of 16. Blocks that have count 0 may be all cleanup and just need to have their neighbors checked to see if they are all cleanup.

Cleanup and Refinement Passes

For the cleanup pass, addressing is data dependent and may be generated using the following psuedo code. The address x,y of the next coefficient in the cleanup pass is input.
   module cleanupAddress(x, y, addrA, addrB, addrC, addrD)

```
    input [5:0]x;
    input [5:0]y;
    output [6:0]addrA;
    output [6:0]addrB;
    output [6:0]addrc;
    output [6:0]addrD;
    wire [5:0]yp2;
    wire [4:0]ax;
    wire [4:0]bx;
    wire [4:0]cx;
    wire [4:0]dx;
    assign yp2=y+2;
    assign ax=(x[1:0]==3)?x[5:2]+1: x[5:2];
    assign cx=(x[1:0]==3)?x[5:2]+1: x[5:2];
    assign bx=(x[1:0]==0)?x[5:2]-1: x[5:2];
    assign dx=(x[1:0]==0)?x[5:2]-1: x[5:2];
    assign ay=y[2]?yp2[5:3]+1: yp2[5:3];
    assign by=y[2]?yp2[5:3]+1: yp2[5:3];
    assign cy=yp2[5:3];
    assign dy=yp2[5:3];
    assign addrA={ay, ax};
    assign addrB={by, bx};
    assign addrC {cy, cx};
    assign addrD={dy, dx};
endmodule
```

The addressing used for the cleanup pass may also be used for the refinement pass. However, a smaller neighborhood is sufficient for the refinement pass.

```
If (yp2[1:0]==1) or (yp2[1:0]==2) then
    if yp2[2]==1 then
        just read memories C and D
    else
        just read memories A and B
else
    read memories A, B, C and D
```

Sequential Addressing for all Passes

Figures 9, 10:
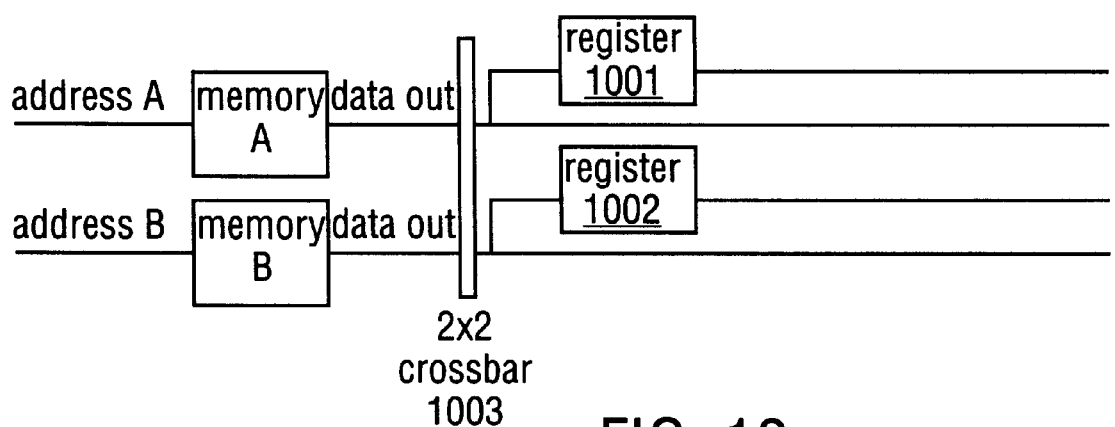
FIG. 9 illustrates one embodiment of an organization of a significance memory for sequential accesses of a 16×16 code-block.
FIG. 10 illustrates one embodiment of the memories and registers used for the significance propagation pass.

With sequential addressing for all passes, a simpler memory organization using two memories can be used. FIG. 9 illustrates one embodiment of an organization of a significance memory for sequential accesses of 4×4 regions of a code-block. Referring to FIG. 9, each 4×4 region is assigned to one of two memories A or B. This allows parallel access for everything needed for a 16×16 block. Note that the first code-blocks are only half because the offset is similar to that described above and only two rows of coefficients are relevant when processing 8×8 blocks such as in FIG. 6 where the top two rows do not include actual data being processed.

FIG. 10 illustrates one embodiment of the memories and registers of a memory path used for the significance propagation pass. Referring to FIG. 10, memory A in response to address A generates data output. Similarly, memory B generates data output in response to address B. A 2×2 crossbar 1003 has inputs coupled to the outputs of memories A and B. One output of crossbar is coupled to register 1001 and one output of the memory path. The other output of crossbar 1003 is coupled to register 1002 and the other output of the memory path. Thus, the outputs of memories A and B may be stored in either registers 1001 and 1002 and on either output. Data read out from memories A and B is for a 4×4 region. Registers 1001 and 1002 store a 5×4 region. When registers are loaded, the rightmost 1×4 column is moved to the leftmost 1×4 column and the other columns are loaded from the memory data output. Crossbar 1003 controls the output of the data from memories A and B to the proper outputs of the memory path via "ping-ponging" data into the outputs as data is processed row after row.

Figure 11:
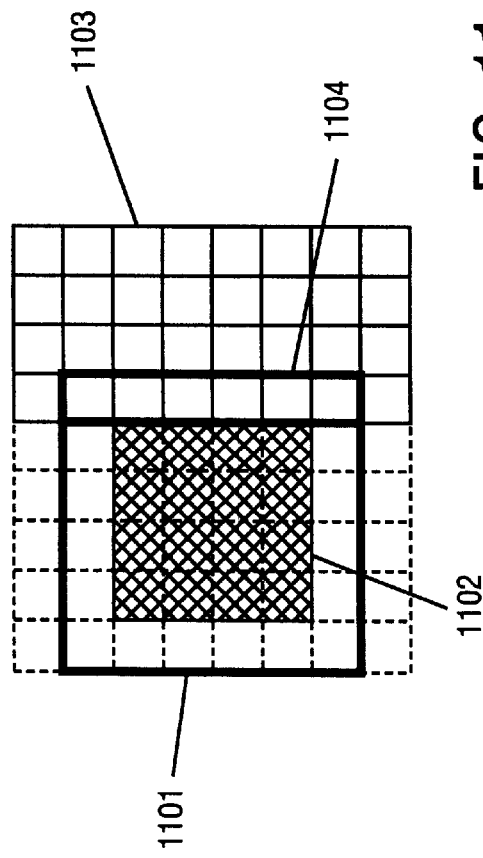
FIG. 11 shows how memory and registers may be used to provide the proper region for context model operation.

FIG. 11 shows how memory and registers of FIG. 10 are used to provide the proper region for context model operation. Referring to FIG. 11, region 1102 is a 4×4 region of coefficients to be processed. Region 1101 represents a 5×6 region stored in registers 1001 and 1002 used for context modeling (with the 5×1 regions above and below the 5×6 region being ignored). Region 1103 is a 4×8 region from memory. Region 1104 is a 1×6 region from memory used for context modeling.

One embodiment of the pseudo code for addressing memory for all three coding passes is as follows.

```
address_A_y=0
address_B_y=0
for y=0 to 60 step 4
    address_A_x=0
    address_B_x=0
    clear registers
    read memory A (will be registered next)
    read memory B (will be registered next)
    for x=0 to 60 step 4
        address_A_x=x+4
        address_B_x=x+4
        if x<60 then
            read memory A (will be registered next)
            read memory B (will be registered next)
        else
            use "all bits zero" for memory A output
            use "all bits zero" for memory B output
        process 4x4 block of coeffcients x . . . x+3, y . . . y+3
    if y AND 4 ==0
        address_A_y=address_A_y+8
    else
        address_B_y=address_B_y+8
```

The memory contains state to indicate the correct pass for the refinement and cleanup passes. The state may be 2 bits per coefficient to distinguish between the three states (significance propagation, clean-up and refinement).

During the significance propagation pass, in parallel for all 16-coefficients, the state is set to refinement for all significant coefficients and to cleanup for all non-significant coefficients. As the processing on the 16-coefficients continues, the state of any coefficients that are in the significance propagation pass is changed from cleanup to significance propagation. The state may be 1 bit per coefficient, referred to herein as the "pass" bit. In one embodiment, the significance state and the pass bit are used to determine the correct pass. Table 6 below illustrates use of the pass bit. Since 1 bit per coefficient is used, this uses less memory than the run and skip count methods described herein.

TABLE 6

Using "Pass" Bit

| pass | significance state, pass bit | | comment |
|---|---|---|---|
| | current | next | |
| significance propagation | 1,x | 1,1 | in refinement pass* in parallel for all 16 coefficients at start |
| | 0,0 | 0,0 | in cleanup pass |
| | | 0,1 | code "0" in significance propagation |
| | | 1,0 | code "1" in significance propagation |
| | 0,1 | 0,1 | code "0" in significance propagation |
| | | 1,0 | code "1" in significance propagation |

TABLE 6-continued

Using "Pass" Bit

| pass | significance state, pass bit | | comment |
|---|---|---|---|
| | current | next | |
| refinement pass | 1,1 | 1,1 | |
| cleanup pass | 0,0 | 0,0 | still not significant |
| | | 1,x | became significant |

*In one embodiment, this is done in a parallel for all 16 coefficients at the start of processing for the 4 × 4 block.

The memories providing access to 2×4 regions can be 48 bits wide with significance state, pass and sign bits for each coefficient.

Figure 12:
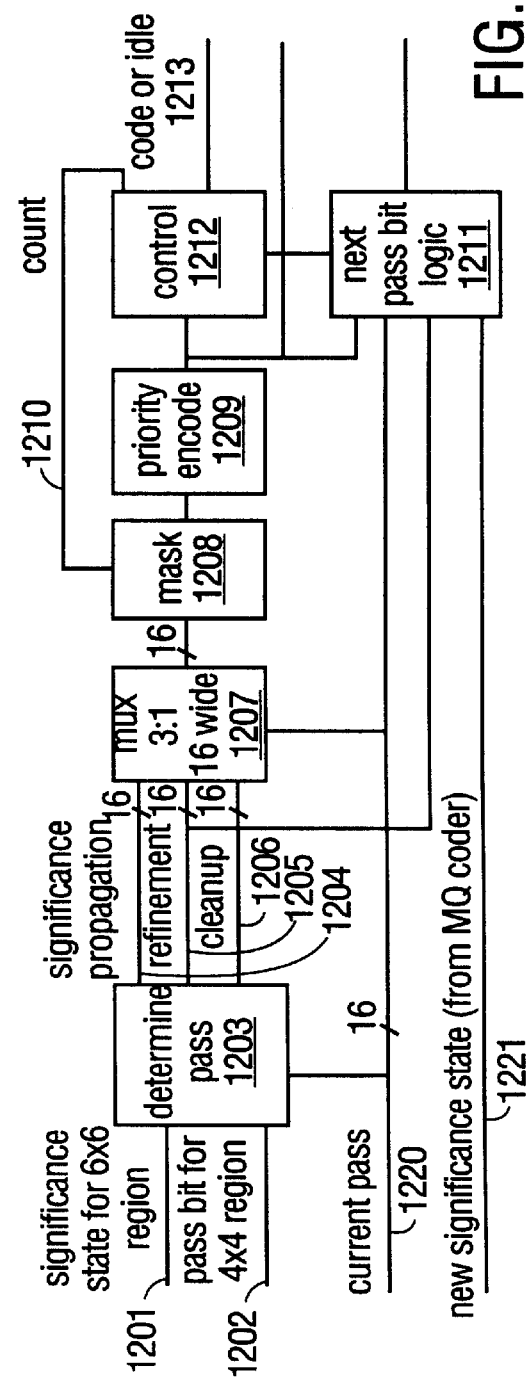
FIG. 12 is a block diagram of one embodiment of pass determination logic.

FIG. 12 is a block diagram of one embodiment of pass determination logic that implements Table 6 above and uses a priority encoder to find each coefficient that is in the current pass. Referring to FIG. 12, determine pass logic 1203 receives a significant state 1201 for a 6×6 region, a pass bit 1202 for a 4×4 region, and a current pass signal (or other indication) 1220 that indicates the current pass. Pass bit 1202 comprises a signal for each coefficient in the 4×4 region (i.e., 16 signals). In response to these inputs, determine pass logic 1203 generates an output to indicate the pass for the 4×4 region. In so doing, for each coefficient in the 4×4 region, determine pass logic 1203 asserts signals 1204 to indicate a significance propagation pass bit for coefficients in the significance propagation pass, signals 1205 to indicate a refinement pass bit for coefficients in the refinement pass, or signals 1206 to indicate a cleanup pass bit for coefficients in the cleanup pass.

Selective logic 1207 is responsive to current pass signal 1220 to output one of the indications 1204–1206 to mask logic 1208. In one embodiment, selective logic 1207 comprises a 16×3:1 multiplexer (Mux). Mask logic 1208 generates a signal in response to count signal 1210, which indicates the coefficient currently being processed. The output of the mask 1208 is input to priority encoder 1209 which outputs the signal to control logic 1212. Mask logic 1208 and priority encoder 1209 operates in a manner similar to their named counterparts in FIG. 7. In response to the inputs, control logic 1212 generates a code or idle indication on signal line 1213 and a count signal 1210.

Next pass bit logic 1211 receives an output from priority encoder 1209 (indicating the position of the coefficient currently being processed), the current pass signals 1220, a new significant state 1221 from an MQ coder, and the refinement pass signals 1205. The refinement pass signals 1205 represent significance state information by indicating whether coefficients are previously significant. Together, current pass signal 1220 and new significance state 1221 indicate whether processing is in the cleanup pass. In response to the inputs, next pass logic 1211 generates a next pass bit, which is used as an output to distinguish between 'code "0"' and 'code "1"' cases in Table 6. The next pass bit may be stored in memory and used subsequently as the pass bit 1202.

The operation of the logic in FIG. 12 is described in the pseudo code below. Such functionality may be included in MQ-coders $2908_{1-N}$. The significance state and pass bit are cleared before processing the first cleanup pass.

```
count=0
if significance propagation pass then
    set next pass bit to "1" for all coeffients in refinement
       pass
while (count<16)
    if significance propagtion pass then
       in_pass=coefficients in significance propagtion pass
    else if refinement pass then
       in_pass=coefficients in refinement pass
    else
       in_pass=coefficients in cleanup pass
    mask=(1<<count)−1
    in_pass_masked=in_pass AND (NOT mask)
    use priority encoder to find next coefficient in pass, N
    if next coefficient found
       code coeff N
       if significance propagation pass then
          next pass bit=NOT next significance state
       else next pass bit=pass bit
       count=N+1
    else
       count=16
       idle for coeff N
       next pass bit=pass bit
```

In the above code, "in-pass" variable is the output of a 3:1 multiplexing function. The "mask" variable represents the mask, and the "in-pass-masked" variable represents the result of applying the mask. The variable N represents the next coefficient in the pass and is the output of the priority encoder. Once this has been found, the control function in the code follows.

In the above code "code coeff N" refers to coding coefficient when the coefficient is in the current pass. The "idle for coeff N" is executed when processing a run.

Double Context Generation

Contexts often depend on the last bit coded, causing a time critical feedback loop between the MQ-coder and context model when decoding. To reduce this context model delay to the time for a simple multiplex, the context model can generate two contexts, one for when the current bit being decoded is "0" and another when it is "1". When the bit is known, selection of the context may occur.

Figure 13:
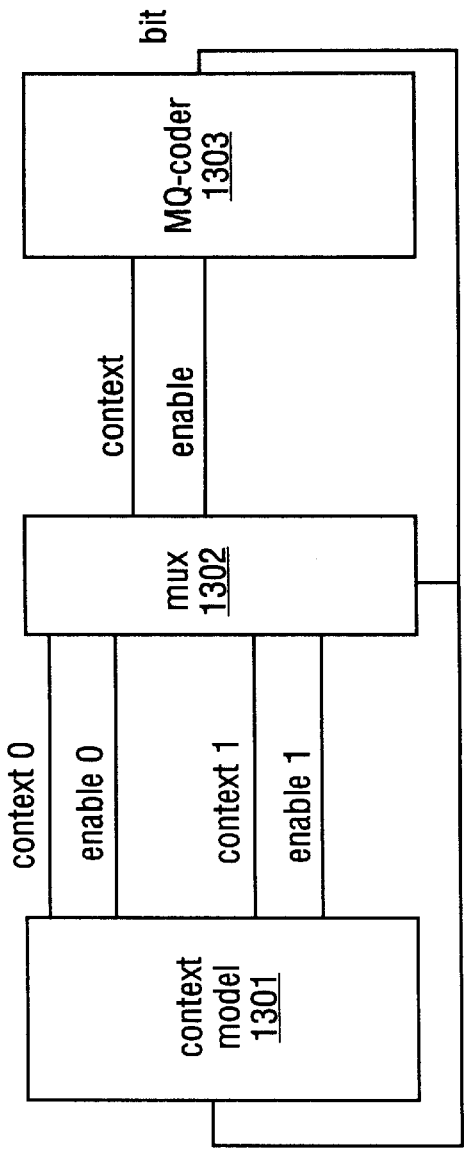
FIG. 13 is a block diagram of one embodiment of double context generation logic.

FIG. 13 is a block diagram of one embodiment of double context generation logic. Referring to FIG. 13, context model generates a context 0, enable 0, context 1, and enable 1. The context model generates 2 contexts, 0 and 1, which are both sent to multiplexer (mux) 1302. Mux 1302 is coupled to receive these signals and generates a context indication and an enable indication to indicate if the context is valid and if a bit should be coded. These outputs are coupled to inputs of MQ coder 1303 which generates a bit. The output bit from MQ coder 1303 is used by mux 1302 to select the context that is to be output to MQ coder 1303. Thus, the context model generates 2 contexts, one for when the current bit is decoded as "0" and another for when it is decoded as "1", and the output bit for the MQ coder 1303 selects the correct one.

For run-length coding for the cleanup passes, Table 7 shows the two possible next contexts for each case and follows the cleanup pass flow described in the JPEG 2000 Standard. The value of the bit coded in the run-length context is used to decide if the next context is for the next group of four coefficients or is in the uniform context for the current group of four coefficients. If this bit is "0", then the run-length coding succeeded in representing four coefficients with one decision and having the MQ-coder idle for the following cycle does not significantly hurt speed performance. After the bit coded in the second uniform context ("uniform B") is a sign bit that is always coded directly in context 9 (with XOR bit 0) in the JPEG 2000 Standard, where the XOR bit being 0 indicates that the sign is not being flipped.

TABLE 7

Double Context Generation for Run-length Coding in Cleanup Passes

| current context (being used by MQ coder) | next context for "0" | next context for "1" |
|---|---|---|
| run-length | run-length or magnitude (or idle) | uniform A |
| uniform A | uniform B | uniform B |
| uniform B | sign | sign |

A and B above refer to the two bits that are described in Section D.3.4 as "[t]he next two bits, return with the UNIFORM context" in the JPEG 2000 standard.

For the significance propagation and cleanup coding passes, the cases without run-length coding are show in Table 8. While a magnitude bit is being coded, the contexts are generated for the magnitude of the next coefficient assuming the current coefficient is "0" or the sign bit context for the current coefficient.

TABLE 8

Double context generation for significance propagation and cleanup coding passes.

| current context (being used by MQ coder) | next context for "0" | next context for "1" |
|---|---|---|
| magnitude bit | magnitude next coefficient | sign for current coefficient |
| sign bit | magnitude next coefficient | magnitude next coefficient |

For the refinement pass, the value of any previous refinement coefficient coded does not effect the context.

MQ-Coder

MQ-Decoder Dataflow with Late Context

Figure 14A:
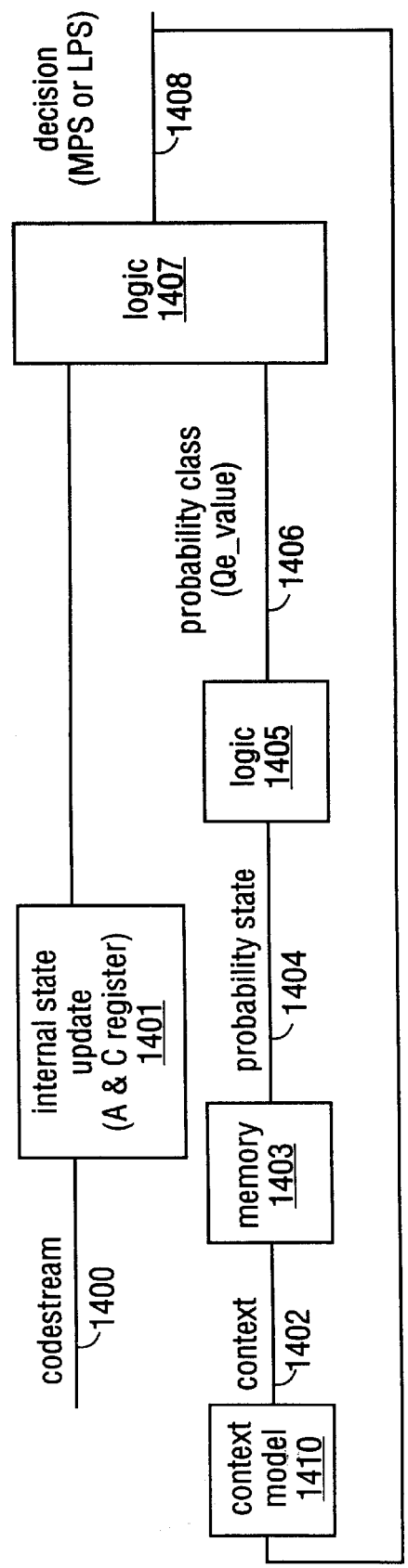
FIG. 14A is a block diagram of one embodiment of an "early context" MQ-decoder.
Figure 14B:
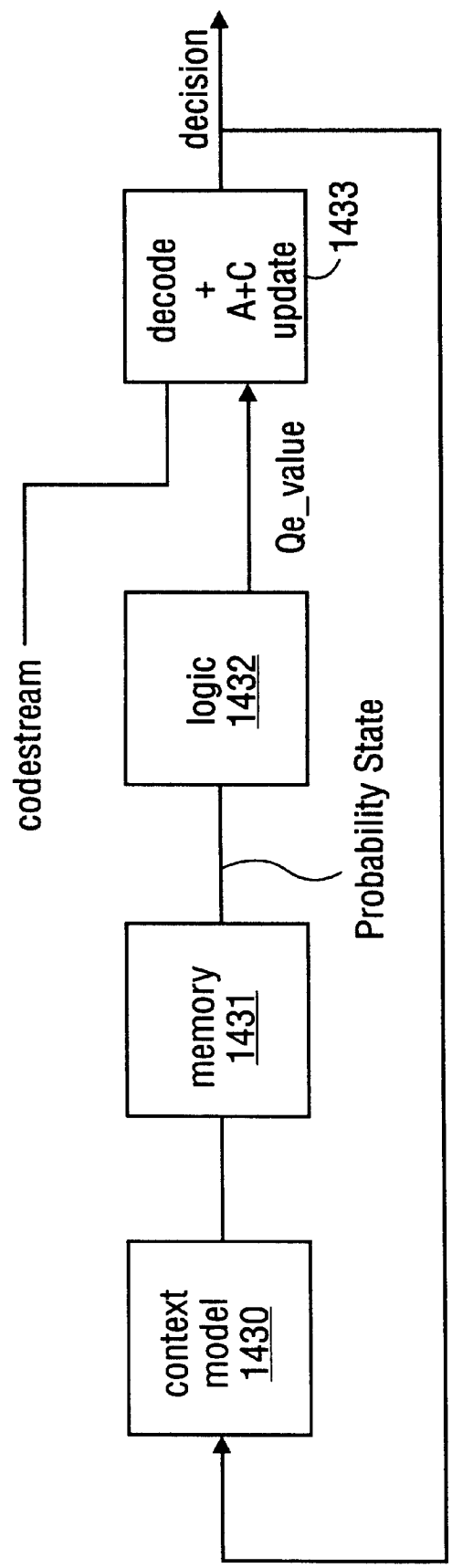
FIG. 14B is one embodiment of a typical decoding implementation.

FIG. 14B is a block diagram of a typical decoding implementation. Referring to FIG. 14B, context model 1430 provides a context to a memory 1431 where a probability state is determined. The probability state is converted with logic 1432 to a "Qe_value" for the arithmetic coder 1433, which updates an internal A & C register and determines a decision (MPS or LPS). All of this must typically happen before the next context can be determined. In many hardware implementations, the decode speed is limited by a large feedback loop (feeding back to context model 1431).

In contrast, FIG. 14A is a block diagram of one embodiment of an "early context" MQ-decoder. In this case, the feedback loop has much simpler logic 1407, instead of an entire decode operation. Therefore, much of the decode and update can be done in parallel with the lower feedback loop 1401.

Referring to FIG. 14A, codestream 1400 is input and updates the internal state 1401. In one embodiment, the A and C register of the internal state specify a current interval as set forth in the JPEG 2000 Standard in Appendix C. The register A indicates the current interval and the code register C is the concatination of the Chigh and Clow registers.

Context 1402 is provided by context model 1410. Context 1402 is used to look up probability state 1404 in memory 1403, which is then converted by logic 1405 to a probability class (Qe_value) 1406. Qe_value 1406 represents the current estimate of a less probable symbol (LPS). Qe_value 1406 is compared with A and C register values as set forth in FIG. C-15 of the JPEG 2000 Standard of the MQ-coder's internal state by logic 1407 to generate the output decision 1408, which may be a more probable symbol (MPS) or LPS. The output decision 1408 is input to context model 1410. In one embodiment, the operations on the Qe_value and the internal state require 16-bit arithmetic. Operations of these blocks implement the decoding of a decision as set forth in section C.3.2 of the JPEG 2000 Standard.

FIG. 15 is a block diagram of one embodiment of a "late context" MQ-decoder. Referring to FIG. 15, 16-bit processing has been eliminated from the context model feedback loop. Codestream 1501 is received as an input to update logic 1503, which updates the internal state 1503, including the A and C registers that specify the current interval. The new A and C register values and the codestream are input to logic 1504 which generates two pclasses as described below, pclass 1509 and pclass 1510, which are input to comparison logic 1511 and 1512.

Context model 1520 generates context 1502. Context 1502 is used to look up a probability state 1506 of memory 1505. In one embodiment, memory 1505 comprises a look up table. Identification of probability state 1506 allows determining the Qe_Value. Probability state 1506 output from memory 1505 is converted by logic 1507 into probability class (index) 1508.

Comparison logic 1511 determines if pclass 1509 is greater than the probability class index 1508 and comparison logic 1512 compares to determine whether probability class index 1508 is greater than pclass 1510. The results of both comparison logics 1511 and 1512 are input to AND gate 1513 such that if both comparisons are true, a decision is output. This decision may be an MPS or LPS. Thus, context 1502 is converted into a 5 bit probability class index 1508 (since there are 32 possible values for Qe_Value in JPEG 2000). The internal state is used to generate two 5-bit probability class indices. If the index corresponding to the context is outside the two indices generated from :the state, the decision is a MPS; otherwise, it is a LPS (i.e., inside the two indices).

An important advantage of the embodiment of FIG. 15 is that the internal state update is parallel with generating the next probability class (indices) 1508, instead of serially as shown in FIG. 14B. Also, because two probability classes are only 5 bits when compared to a pclass index, the arithmatic is much simpler.

Logic 1504 of FIG. 15 creates the information that is depicted in FIG. 16A. Given the values in the A and C registers, logic 1504 determines what the two split points are for the pclass and then determines if the code is in between or outside the split points. These may be done in parallel.

FIG. 16A illustrates how the comparison of probability class indices works. Referring to FIG. 16A, "pclass 0" is a high skew case with most of the interval devoted to MPS. For "pclass 1" though "pclass 4", the skew is less and the MPS interval shrinks. "pclass 5" shows the MPS a conditional exchange which occurs' for probabilities close to 50%. The "known state" has a codestream value ("code") which would be a MPS for some probability classes and a LPS for others. Because the probability classes are ordered, two comparisons are sufficient to determine if "code" is a MPS or LPS. In other words, in FIG. 16A, given the location of the code in the known state, the decision will be an MPS for pclass 0–3, but will be an LPS always for pclass 4, and then again an MPS for pclass 5. Instead of figuring out whether it will be an MPS or LPS for each probability class, only the two breakpoints (between pclass 3 and 4 and between pclass 4 and 5) need to be determined. Therefore, when the QE value is given (when the probability class/index is known), a determination may be made as to what probability class is actually in the space where the break points are.

A similar method in hardware could be used to determine the MPS or LPS for each possible Qe_Value and then multiplex the result. For example, FIG. 16B shows a mux 1610 having a number of inputs, each of which are associated with a pclass and provides as an output either an MPS or LPS depending on the code.

Multiple Bit Decoding with MQ-coder

Figure 17:
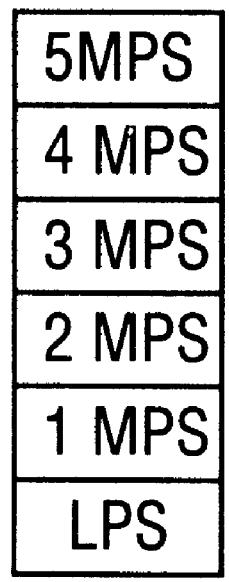
FIG. 17 illustrates the intervals for multiple MPS decoding.

Multiple MPSs can be decoded (for consecutive uses of the same PClass) at one time as long as none of the MPSs or only the last MPS requires normalization. FIG. 17 illustrates the intervals for multiple MPS decoding. In the standard, if the difference between where the codestream is in relation to the interval specified by the A and C registers and the Qe_value is 2 or greater, then multiple MPSs can be decoded. If the interval size is divided by Qe_value and then if the decoder remains in the same context and, thus, the same probability class, then multiple MPSs can be decoded at one time. For example, when looking at the codestream and knowing the 16 bits that are being processed, if the location of the codestream in the interval specified by the A and C registers is multiple Qe_values away, indicating that the same context is going to be used to process the data for multiple cycles, and thus the same probability class, then multiple MPSs may be decoded at one time. In other words, if $$\frac{\text{interval specified by } A \text{ and } C \text{ registers} - \text{location of the codestream}}{Qe}$$

is determined and rounded to the next lowest interger, the result indicates the number of MPSs that may be decoded at one time. This calculation may be performed by well-known hardware.

An Exemplary Implementation of a 5,3 Filter

In one embodiment, a reversible and irreversible 5,3 wavelet filters are used. The term 5,3 refers to the number of taps in the wavelet filters, i.e., the number of non-zero (consecutive) values in the basis function support for the kernal. Reversible implies that performing the forward and the inverse tranformation (using the explicity rounding rules and without performing quantization in any form) will result in the exact same number at the output as the input. Only a modest and predictable increase in precision over the input precision is required for the intermediate mathematical terms. That is, there is no systemic distortion introduced by mathematical precision. Irreversible implies that very high precision is required to ensure no mathematical distortion (exact reconstruction). In practice, however, irreversible filters are almost always combined with quatization creating distortion that overwhelms the systemic mathematical precision distortion.

Figure 24:
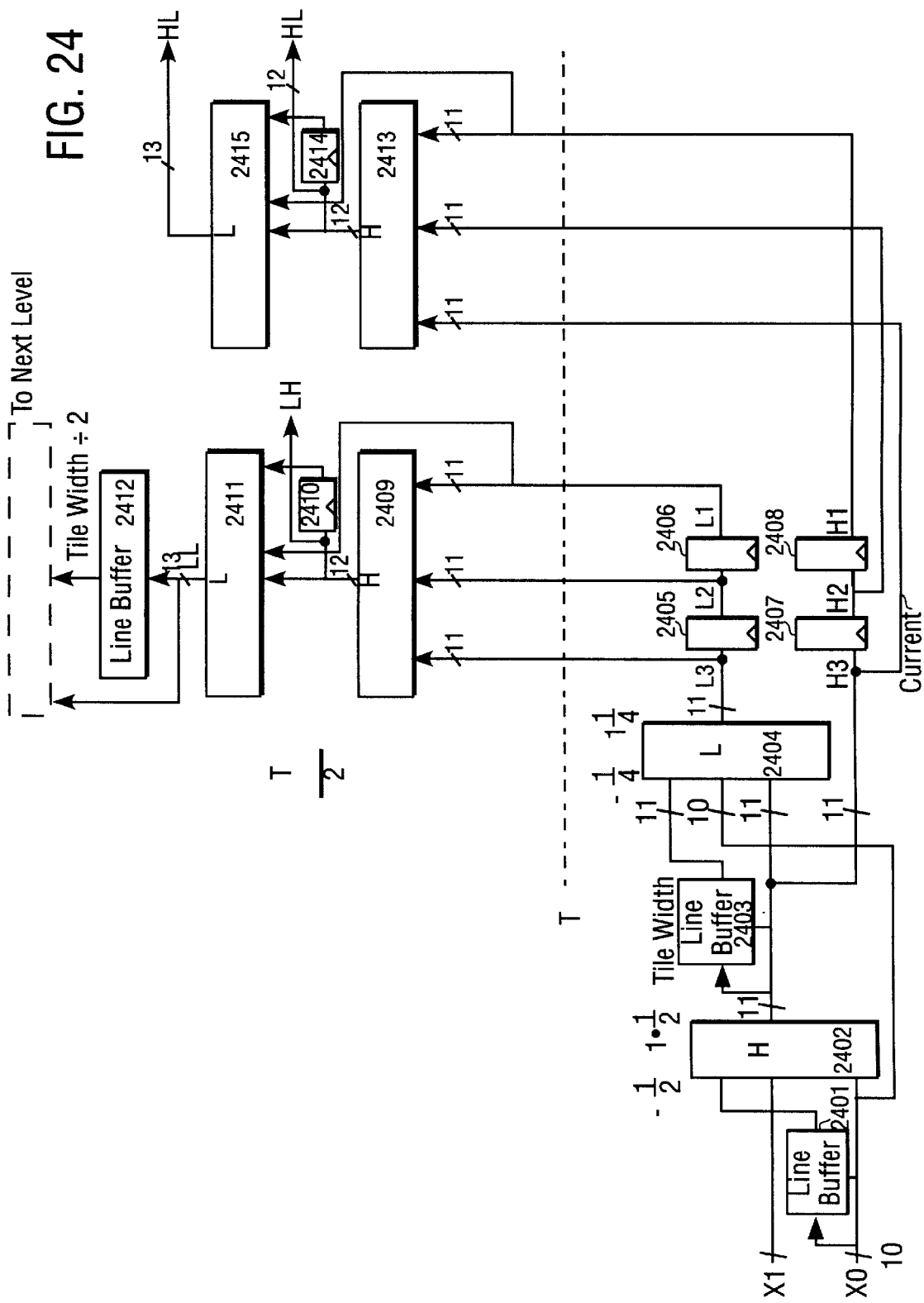
FIG. 24 is a block diagram of one embodiment of a forward transform.

FIG. 24 illustrates one embodiment of a forward transform filter. Referring to FIG. 24, a highpass filter 2402 is coupled to receive lines $x_0 x_1$ and the last $x_0$ from line buffer 2401 and generates an output that is coupled to one input of the lowpass filter 2404 and is stored in line buffer 2403. Line buffers 2401 and 2403 store one line having a tile width. Lowpass filter 2404 also receives an output of the highpass filter 2402 from the previous cycle that is from line buffer 2403 along with the current $x_0$ line and generates an output. The outputs of lowpass filter 2404 for two previous clock cycles are delayed through delays 2405 and 2406, providing the filter output one cycle in the past and two cycles it the past.

Previous outputs of highpass filter 2402 are delayed by delay 2407 and 2408 such that the current output of highpass filter 2402 and the last two outputs of highpass filter 2402 are input to highpass filter 2413. The output of highpass filter 2413 is. a coefficient in the HH subband and is also input to lowpass filter 2415 along previous output of the highpass 2402 two cycles earlier, (two in the past), the output from delay 2408 and the previous output of highpass filter 2413. The output of lowpass filter 2415 is coefficient from the HL subband.

The output of lowpass filter 2404 along with the outputs of delays 2405 and 2406 are input to highpass filter 2409. The output of highpass filter 2409 is the LH subband.

The output of highpass filter 2409 is also input to one of the inputs of lowpass filter 2411 along with the output of delay 2406 and the previous output of highpass filter 2409 as delayed through delay 2410. The output of lowpass filter 2411 is the LL subband. As the LL subband, the output of lowpass filter 2411 is input to a line buffer 2412 the output of which, along with the output of lowpass filter 2411, represent the inputs to the next level of wavelet transform. The next level of wavelet transform may comprise a cascaded version of the wavelet transform in FIG. 24.

Figure 25A:
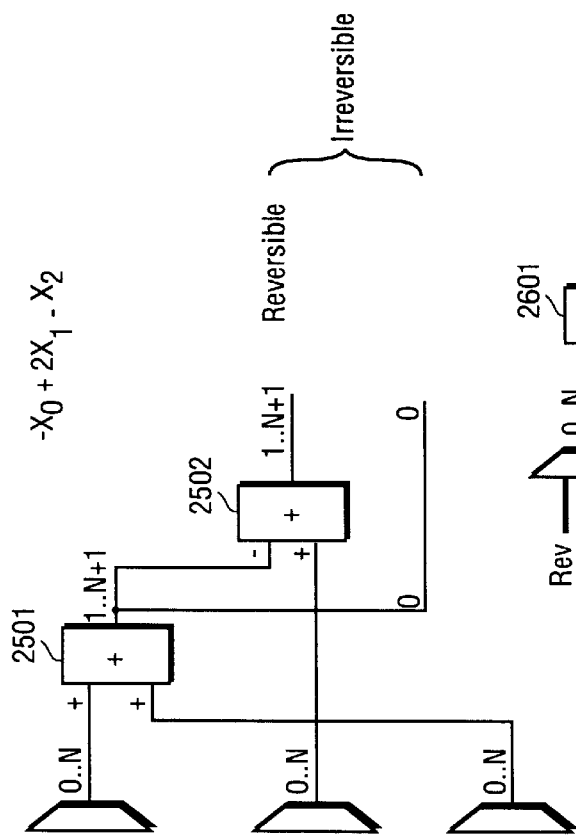
FIGS. 25A and 26B are block diagrams of embodiments of the low pass filter.

FIG. 25A illustrates one embodiment of the lowpass filter, such as may be used in transforms (e.g., the 5,3 transform described above) described herein. The lowpass filter is designed to create an output based on the functions according to the following:

$$-x_0+2x_1-x_2$$

For the reversible case, the lowpass filter operates according to the following equation:

$$x_1 - \left\lfloor \frac{x_0 + x_2}{2} \right\rfloor$$

Figure 25B:
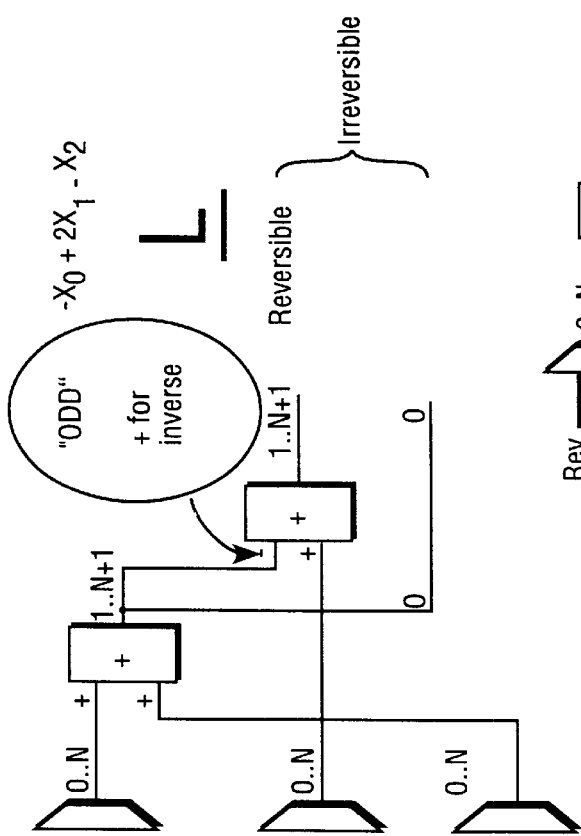

Referring to FIG. 25A, an adder 2501 is coupled to add the last $x_0$ line with the current $x_0$ line. The least significant bit output represents an output of the high pass filter of FIG. 25B and is for the irreversible transform. The remaining bits are input to subtractor 2502 and are subtracted from the $x_1$ input to create an output representing the most significant bits. These most significant bits are all that is required for the reversible case. It should be noted that for an inverse wavelet transform to convert filter in FIG. 25A into an inverse wavelet filter for use as an odd (high pass) filter in an inverse transform, the subtractor 2502 is replaced with an adder. Such an example is shown in the high pass filter of FIG. 25B.

Figure 26A:
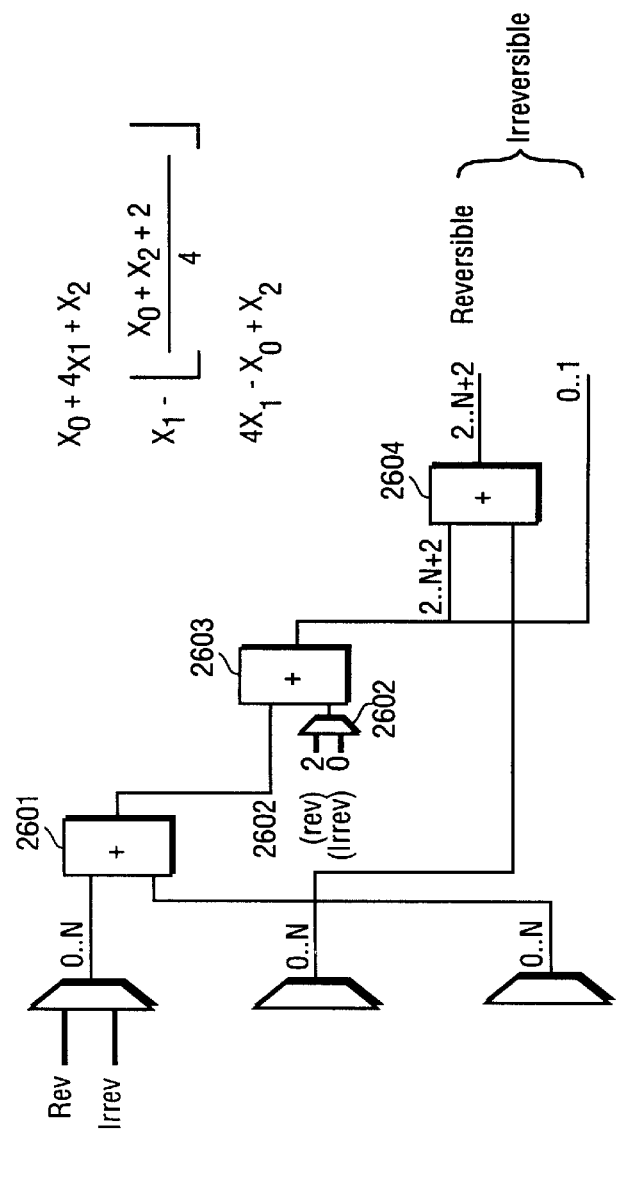
FIGS. 26A and 25B are block diagrams of embodiments of a high pass filter.

FIG. 26A illustrates one embodiment of a highpass filter such as may be used in the transforms described herein. For the irreversible case, the highpass filter operates according to the following equation:

$$4x_1 - x_0 - x_2$$

For the reversible case, the highpass filter operates according to the following:

$$x_1 - \left\lfloor \frac{x_0 + x_2 + 2}{4} \right\rfloor$$

Referring to FIG. 26A, adder 2601 adds either the reversible or irreversible version of the last $x_0$ line to the current $x_0$ line. The output of adder 2601 is added to a rounding term using adder 2603. The rounding term may be 2 in the case of reversible or 0 in the case of irreversible and is supplied by mux 2602. All except the lower two bits of the output of adder 2603 is added to the x1 line using adder 2604 to produce the reversible output. The lower two bits of the output of adder 2603 and the output of adder 2604 represent the irreversible output.

The use of mux 2602 allows a simple switch to be invoked to switch between reversible and irreversible, instead of requiring completely separate hardware for both functions or requiring that reversible rounding effect the irreversible output.

Figure 26B:
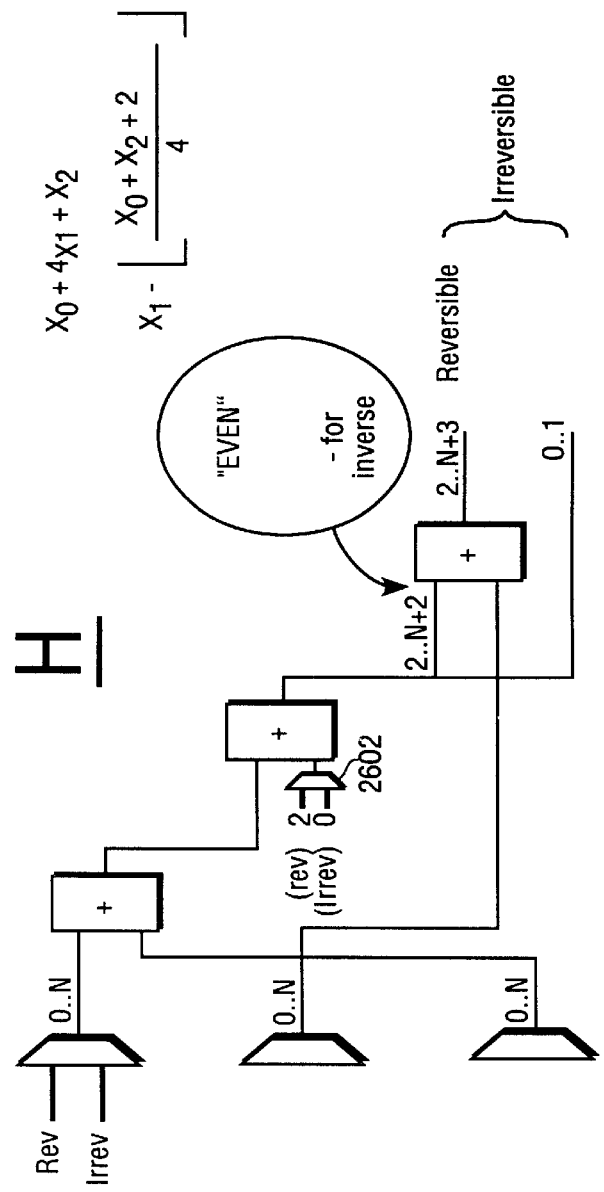

It should be noted that for an inverse wavelet transform to convert filter in FIG. 26A into an inverse wavelet filter for use as an every (low pass) filter in an inverse transform, the adder 2604 is replaced with a subtractor. Such an example is shown in the low pass filter of FIG. 26B.

Figure 27:
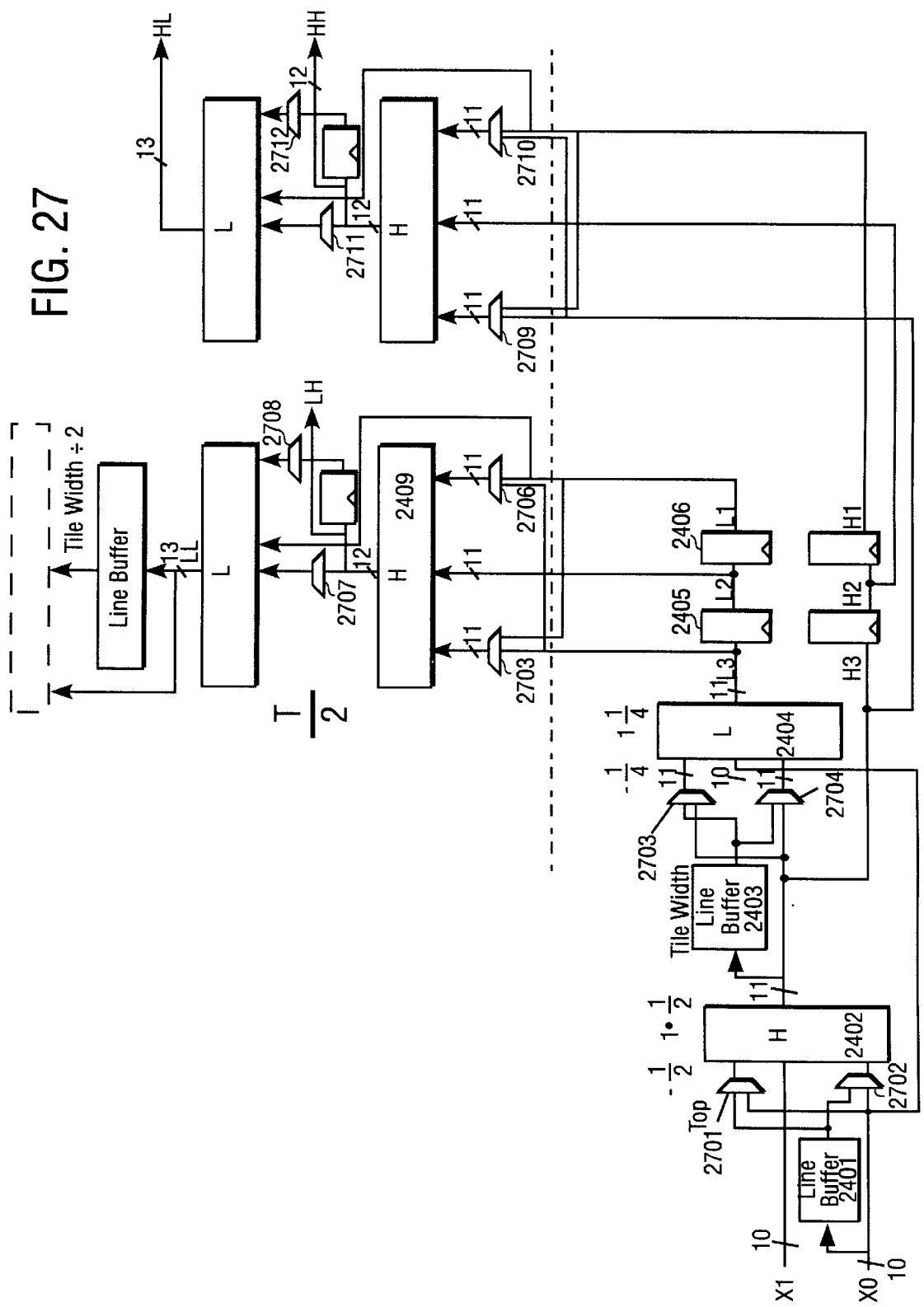
FIG. 27 is a block diagram of an alternative embodiment of a forward transform.

FIG. 27 represents an alternative embodiment of this transform in FIG. 24 that includes multiplexers (muxes) to perform mirroring at the image boundaries. These muxes include mux 2701–2712. For example, mux 2701 allows the $x_0$ line to be used instead of the last $x_0$ line at a boundary when there is no line in the line buffer 2401 (for example, at the top of a tile). Mux 2702 allows the line buffer to provide the other input to lowpass filter 2404 at times when the bottom of a tile has been reached and there is no additional $x_0$ line to be input. Similarly, mux 2703 allows the output of highpass filter 2402 to be used as an input to lowpass filter 2404 in cases where there is no line in line buffer 2403. Mux 2704 allows the input to lowpass filter 2404 to be from line buffer 2403 when there is no output from highpass filter 2402. Muxes 2705 and 2706 allow the inputs to highpass filter 2409 to be the output of delay 2406 and the output of lowpass filter 2404, respectively, when an output to lowpass filter 2404 and an output from delay 2406, respectively, are not available. The same thing can be said for muxes 2709 and 2710, muxes 2707 and 2708, and muxes 2711 and 2712.

Figure 28:
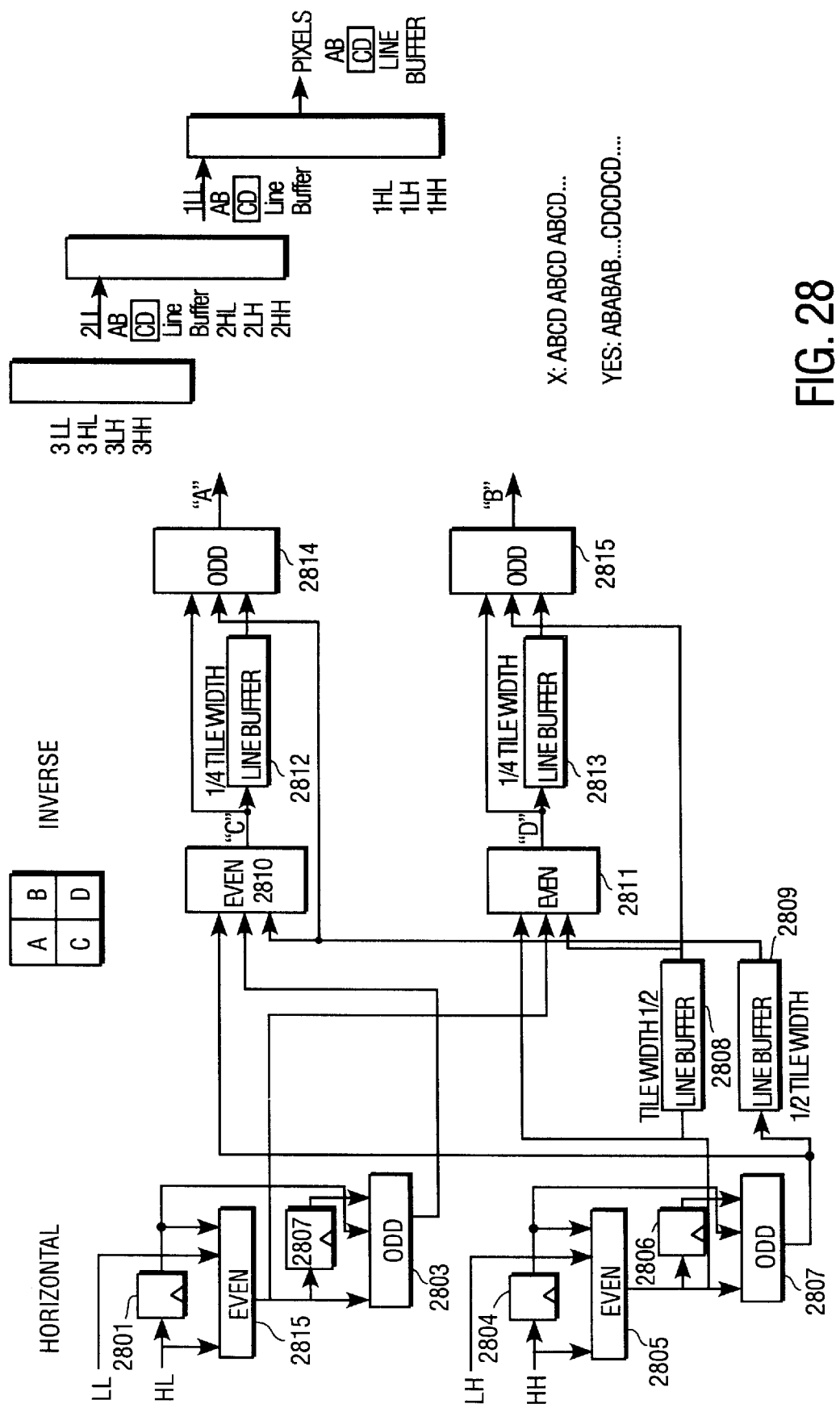
FIG. 28 is a block diagram of one embodiment of an inverse transform.

FIG. 28 is a block diagram of one embodiment of an inverse 5,3 transform. Referring to FIG. 28, even filter 2815 is coupled to receive an LL coefficient, an HL coefficient, and an HL coefficient from the previous cycle from delay 2801. The output of even filter 2815 is coupled to one input of even filter 2811, one input of delay 2802, and one input of odd filter 2803. The other inputs of odd filter 2803 are coupled to the HL coefficient from the previous cycle via delay 2801 and the output fo even filter 2815 from the previous cycle via delay 2802. The output of odd filter 2803 is coupled to one input of even filter 2810.

A similar arrangement exists with respect to the LH and HH coefficients in that filter 2805 is coupled to receive the current HH coefficient and LH coefficient along with the HH coefficient from the previous cycle output from delay 2804. The output of even filter 2805 is coupled to one input of even filter 2811, the input of delay 2806, and one input of odd filter 2807. The other inputs of odd filter 2807 comprise the HH coeffcient from the previous cycle (the output of delay 2804) and the output of even filter 2805 from the previous cycle (the output of delay 2806). The output of odd filter 2807 is input to one input of even filter 2810.

Note that the outputs of even filter 2805 and odd filter 2807 are also coupled and are stored in inputs of line buffer 2808 and 2809. The size of line buffers 2808 and 2809 are equal to ½ the tile width. The outputs of line buffer 2808 are input to the other input of even filter 2811 and one input of odd filter 2815. The output of line buffer 2809 is coupled to one input of even filter 2810 and one input of odd filter 2814.

The output of even filter 2810 is the "C" portion fo the image data that is output, is stored in line buffer 2812, and is coupled to one input of odd filter 2814. In one embodiment, the size of line buffer 2812 is equal to ¼ the tile width. In response to its input, odd filter 2814 generates data corresponding to the "A" portion of the image data.

The output of even filter 2811 corresponds to the "D" portion of image data is input to one input of odd filter 2815 and is stored in line buffer 2813. In one embodiment, the size of line buffer 2813 is ¼ the tile width. The output of line buffer 2813 is coupled to one input of odd filter 2815. The output of odd filter 2815 corresponds to the "B" portion of the image data.

Figure 21:
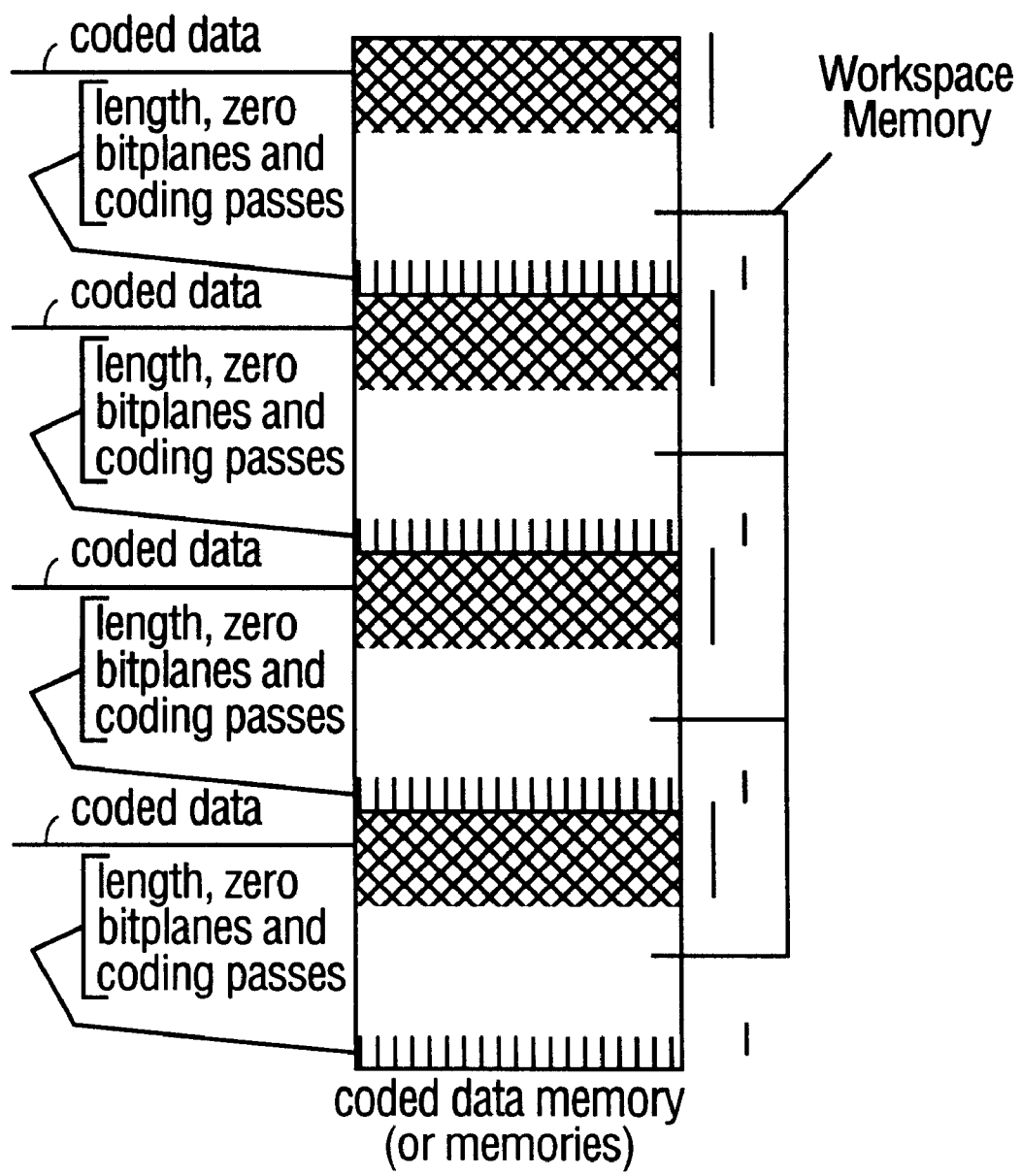
FIG. 21 is a diagram of memory for one embodiment of a coder that includes multiple MQ coders, each having an associated context model.

Other Parallelism Implementation Techniques
Assignment of Code-blocks to Coders for Parallelism It is useful in hardware implementations to code multiple code-blocks in the same tile in parallel. FIG. 21 is a memory usage diagram of one embodiment of a coder that includes multiple MQ coders, each having an associated context model, that may be used to process multiple code-blocks.

Referring to FIG. 21, each MQ coder is allocated memory (e.g., separate memory or some portion of one or multiple memories). In one embodiment, a portion of the allocated memory stores the coded data, with the length, zero bitplanes, and coding passes stored in another portion of memory.

Figure 18:
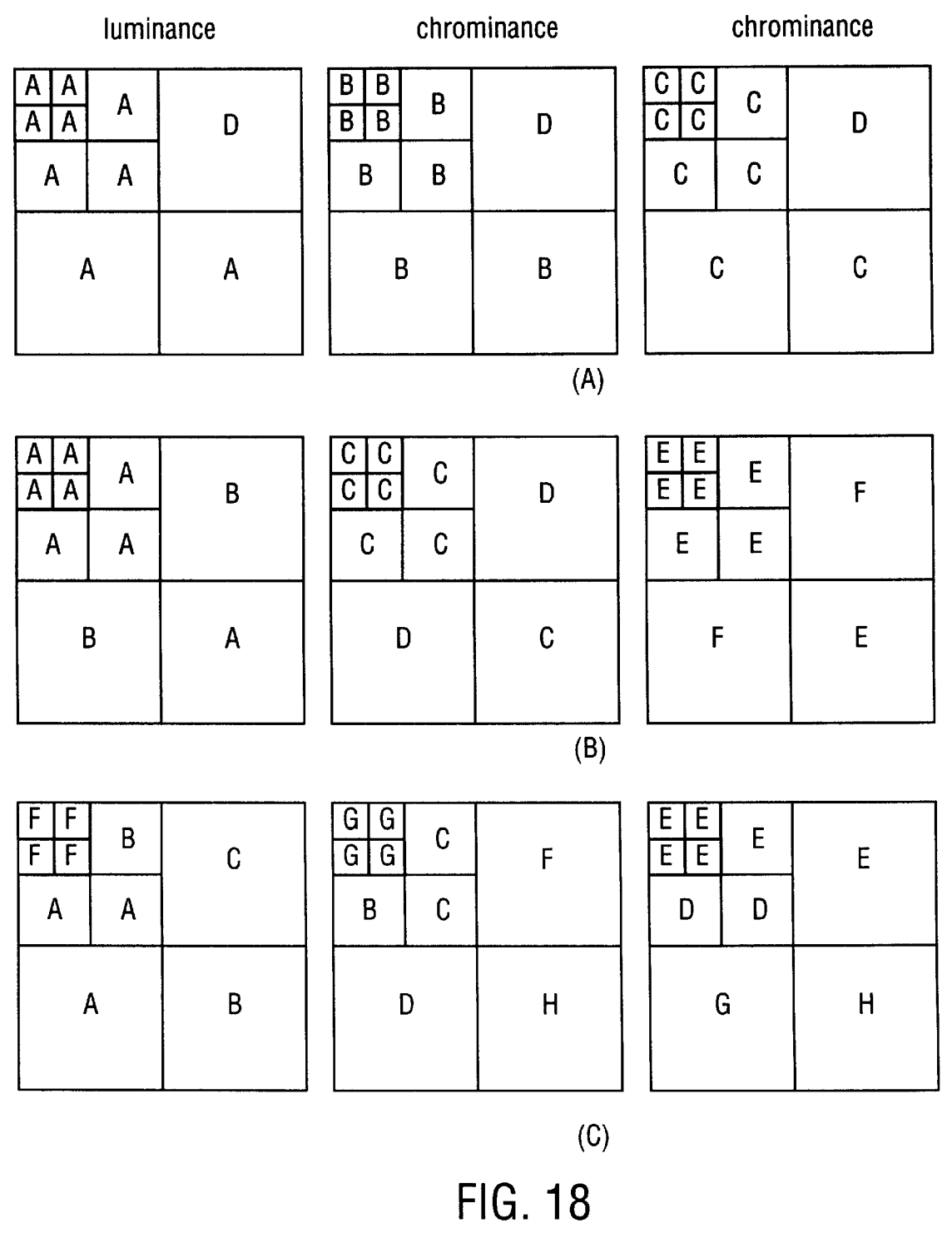
Figure 19:
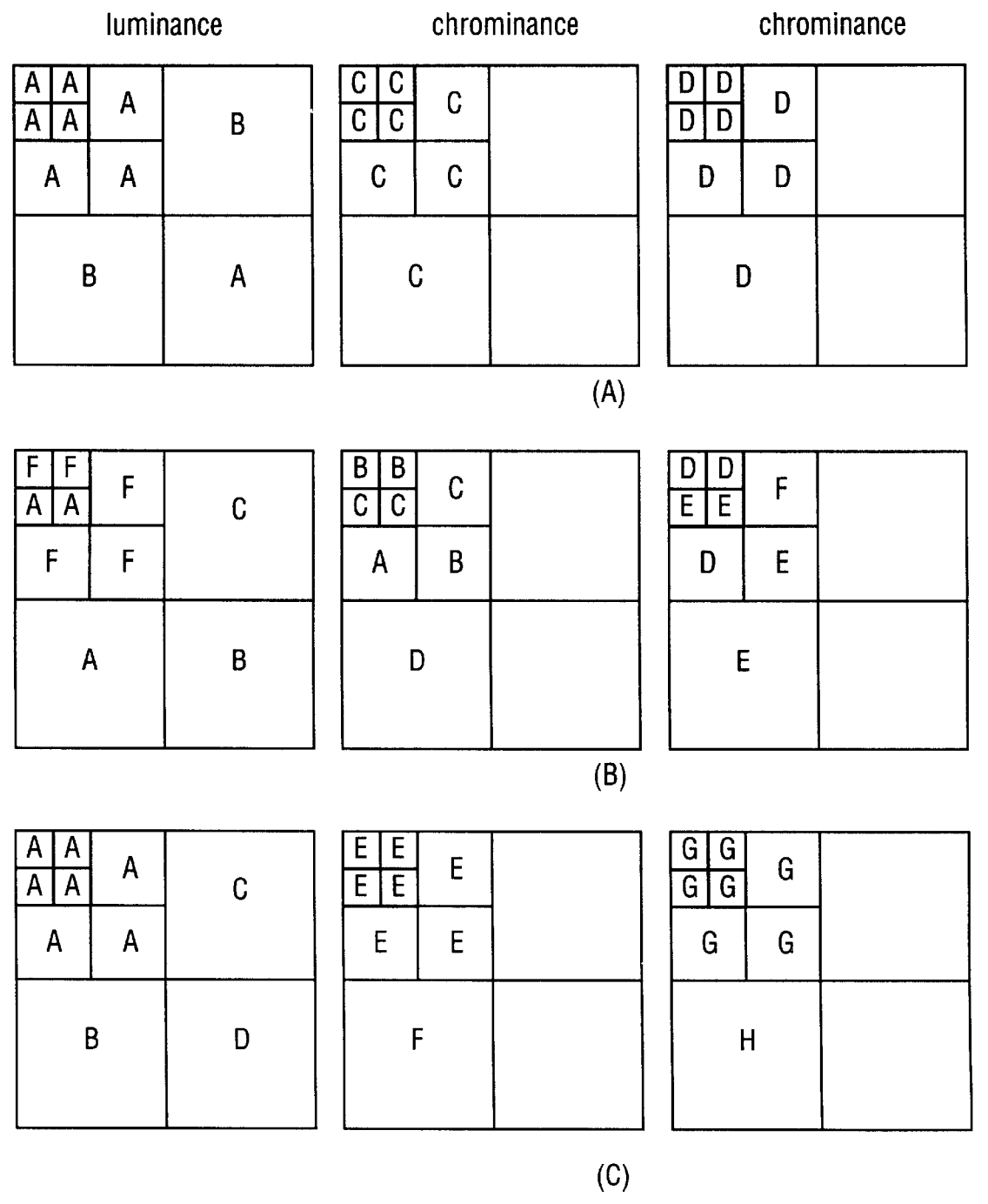
Figure 20:
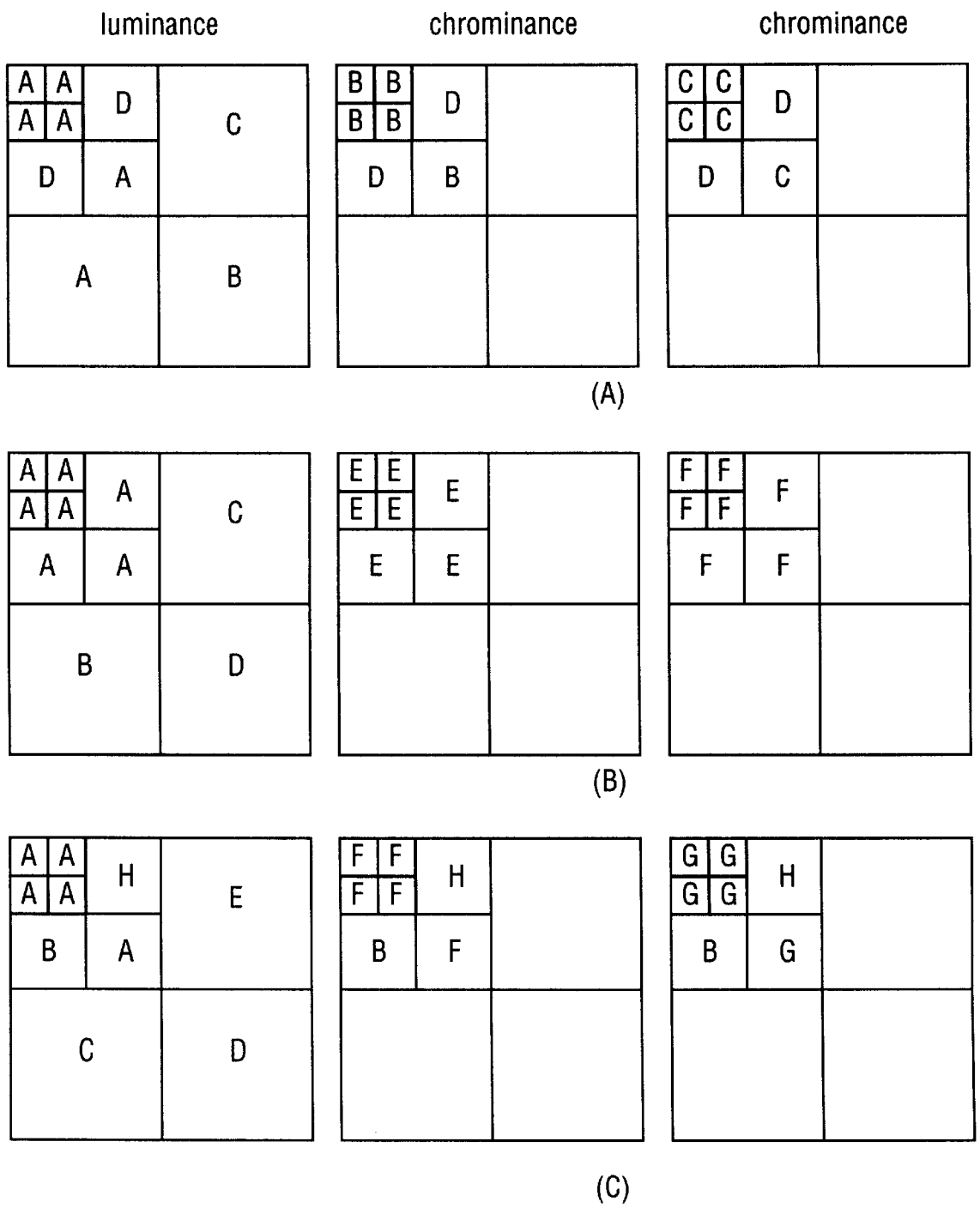
FIG. 20 illustrates an alternative embodiment of an assignment of code blocks in parallel for 4:1:1 data.

FIGS. 18–20 show assignment of code-blocks to parallel units for 128×128 tiles, 64×64 code-blocks and three transform levels, respectively. The assignments are made to balance the amount of coding to be performed by each of the parallel coders. In one embodiment, code-blocks are assigned so that each MQ coder codes, to the extent possible, approximately the same number of coefficients, with a balance between higher level and lower level coefficients. Other configurations are possible.

FIG. 18A–C illustrate embodiments of code-block assignments for 4:4:4 data when 4, 6, and 8 MQ coders are being used in parallel, respectively. In FIG. 18C, for 8 units in parallel, the code-blocks assigned to parallel unit "H" (1HH chrominance subbands) will often be heavily quantized (have few non-zero bitplanes to code) so it is likely that this unit can process more coefficients than the other units per unit time.

FIGS. 19A–C illustrate embodiments of code-block assignments for 4:2:2 data when 4, 6, and 8 MQ coders are being used in parallel, respectively.

FIGS. 20A–C illustrate embodiments of code-block assignments for 4:1:1 data when 4, 6, and 8 MQ coders are being used in parallel, respectively. In FIG. 20C for 8 units in parallel, it is expected that units C, D and E process more coefficients per unit time than the other units.

The coder of FIG. 29 may be used to perform the coding described above. For example, each one of N MQ-coders of bit modeling MQ-coders $2908_{1-N}$ may be assigned to any of A–H shown in FIGS. 18–20.

Note that although even numbers of MQ coders in parallel are discussed with respect to FIGS. 18–20, an odd number of MQ coders in parallel may be used.

Reduced Memory for Storing Coefficients in Hardware

Reducing memory usage for storing coefficients when not decoding losslessly can make use of zero bitplane information. If the hardware can store N bitplanes for each coefficient, decoding can terminate after N bitplanes are decoded. Any following bitplanes can be quantized (truncated).

Figure 22A:
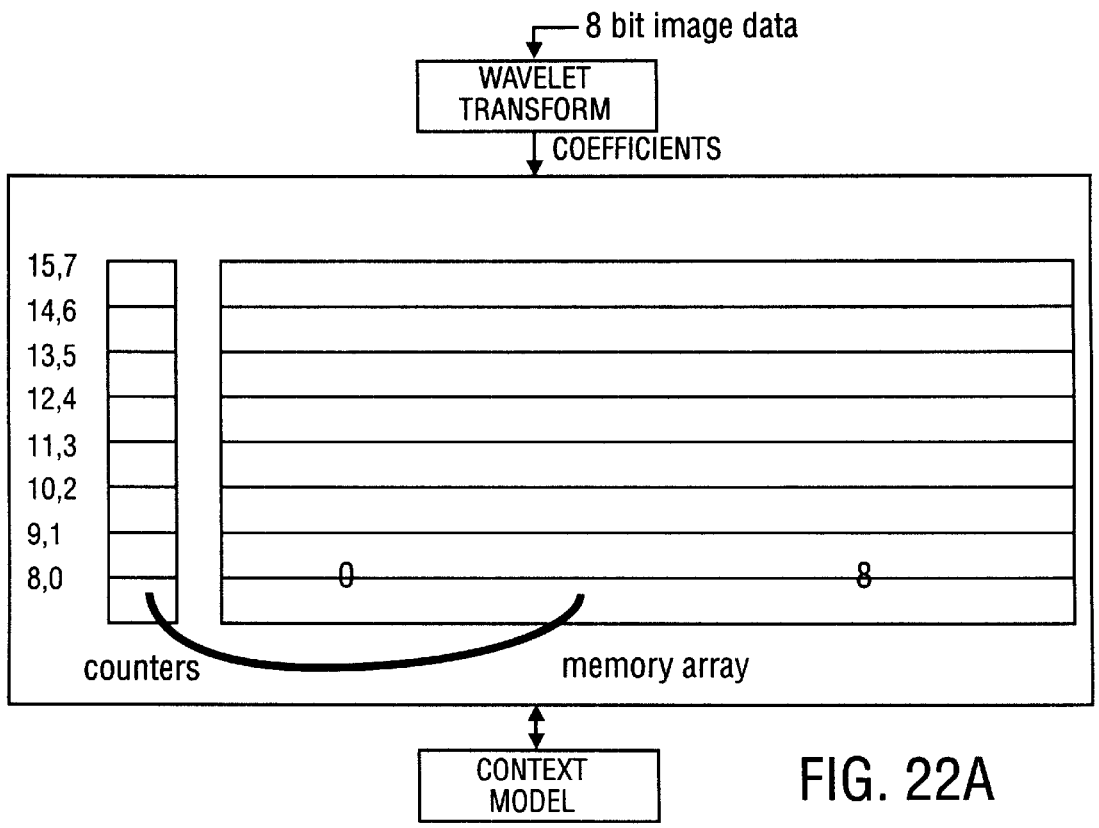
FIG. 22A shows how to use a limited number of bitplanes of memory for each coefficient during encoding.

FIG. 22A illustrates use of a limited number of bitplanes of memory for each coefficient during encoding. For example, 8 bitplanes of memory (N=8) can be used to encode coefficients with 16-bits in a normal representation. Those coefficients are part of a subband other than the LL subband (where the LL subband coefficients are not quantized) that are generated as a result of applying a wavelet transform to image data. In one embodiment, the wavelet transform comprises a 5,3 wavelet transform as described herein. The wavelet transform may comprise multiple 5,3 wavelet transforms operating in parallel to generate LL, HH, LH and HL subbands in parallel. A memory storing coefficients from the wavelet transform may be accessed by a context model to perform encoding based on the coefficient bits.

During encoding, coefficients are stored before the number of zero bitplanes is known. Counters count the number of initial zeros for more significant bitplanes 8 . . . 15. As long as a bitplane 8 . . . 15 is all zero, the memory stores information (magnitude) for the corresponding bitplane 0 . . . 7. Once a one occurs in a bitplane 8 . . . 15, the corresponding counter stops and memory stores information for the corresponding bitplane 8 . . . 15. At the end of encoding a code-block, the counters either indicate all zeros for a bitplane 8 . . . 15 and that the corresponding bitplane 0 . . . 7 is in memory in the case that the counter stores a value at the end of the memory, or they indicate the starting address for bitplane 8 . . . 15 data in memory and that the corresponding 0 . . . 7 bitplane should be truncated (quantized). Thus, the counts act as sideband information to indicate that information stored in the memory array from the beginning of a row up to the location in the row at the position indicated by the count is no longer needed data. The results of truncation is that the least significant bitplanes are dropped.

A separate bitplane of memory can be used to store sign information or the sign information can be stored with the significance state.

Figure 22B:
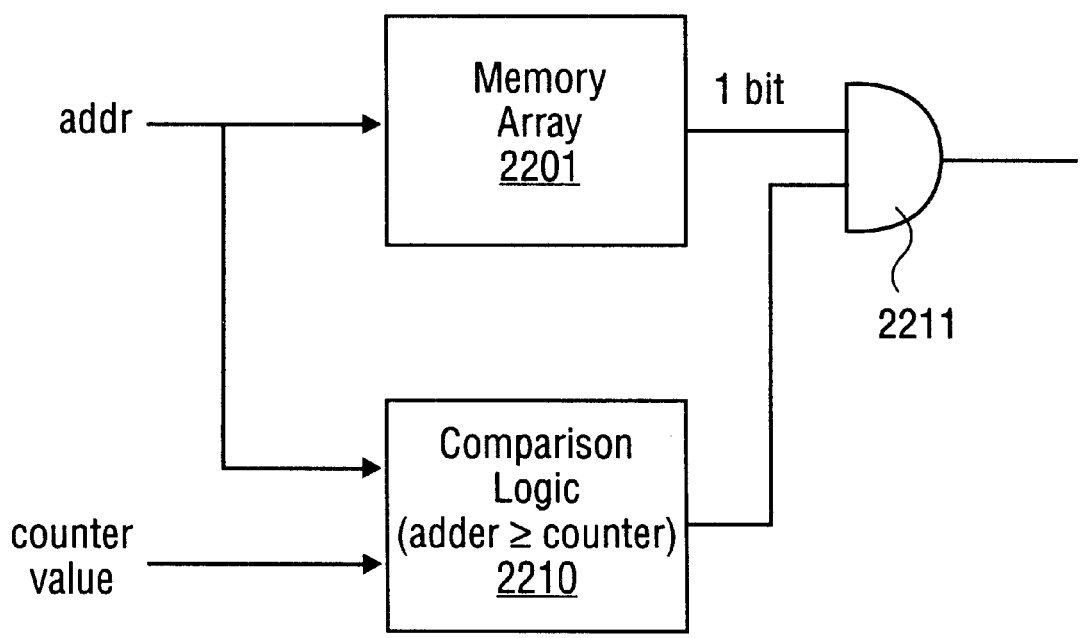
FIG. 22B illustrates a block diagram of one embodiment of control logic to control access to the memory.

In alternative embodiment, a small amount of memory may be used for variable length (VL) code information (e.g., run length code) instead of counters. This allows a bitplane with a small number of one bits to be stored in a small portion of memory for each bitplane. Once the bits have been stored in the memory, a context model accesses the memory to obtain the bits. However, since each row may potentially contain data that is to be quantized, and therefore, need not be accessed and used by the context model. FIG. 22B illustrates a block diagram of one embodiment of control logic to control access to the memory. This logic may operate in conjunction with or be part of a context model accessing the memory.

Referring to FIG. 22B, an address, addr, accesses memory array 2201 generating a bit. The address and the counter value associated with the row of memory containing the address are input to comparison logic 2210. If comparison logic 2210 determines that the address is greater than or equal to the counter value for the row, then the 1–bit output from memory array 2201 is output; otherwise, a zero is output.

Figure 23:
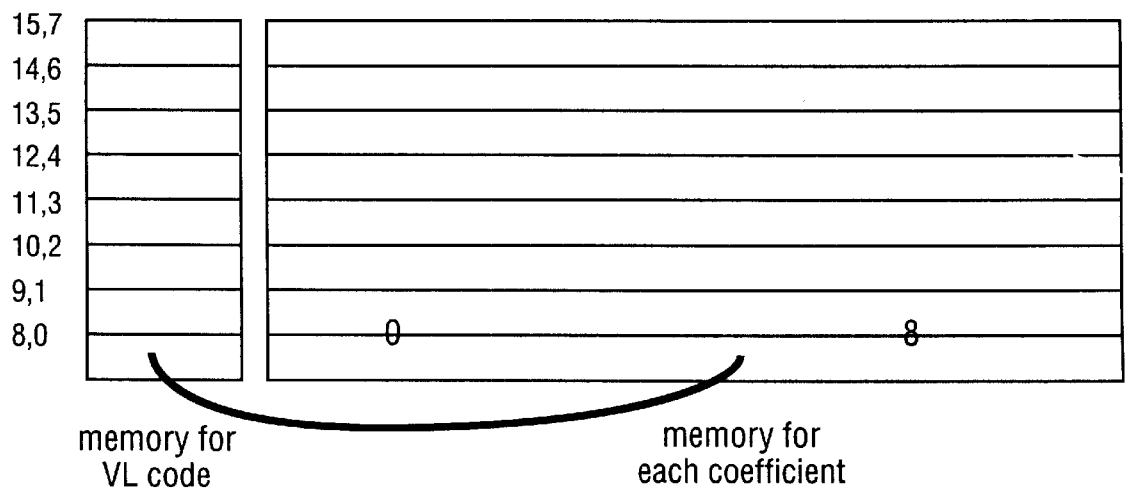
FIG. 23 illustrates using a small amount of memory for variable length (VL) code information instead of counters.

FIG. 23 illustrates a portion of memory from a VL code and a memory array storing coefficients. The VL code may be used to indicate the presence of a 1 bit by indicating an amount of bits to skip until the next one is encountered in the row. Thus, this VL code is made to indicate two counts so that the access logic knows where the next bit-plane is. Other VL codes could be used to provide more than two counts. Use of VL codes typically allows one less full bitplane of memory to be used. If the small memory is 1/32 of the size of the code-block (per bitplane), then a R2[8] code might be used. If the small memory is 1/16 of the size of the code-block, then a R2[6] or R2[7] code might be used. For more information on R2[8], R2[6], and R2[7] codes, see U.S. Pat. No. 5,381,145 entitled "Method and Apparatus for Parallel Decoding and Encoding of Data," issued Jan. 10, 1995, assigned to the corporate assignee of the present invention.

For video where simultaneous operation of the transform and context model/MQ coder is desired, two banks of memory are needed. For still image applications, one band of memory is sufficient for sequential operation of the transform and context model/MQ-coder.

Although the reduced memory technique discussed above is described in terms of rows, any arbitrary memory area may be used, such as, for example, columns, blocks, pages, regions, etc. Also, separate memories may be used.

Packet Header Processing

To create a codestream, such as, for example, a JPEG 2000 codestream (or bitstream), packet headers are created. In one embodiment, this information may be with a tag tree structure to handle an arbitrary number of code-blocks. In certain situations, tile heades for tiles with a limited number of code-blocks are created. For example, in the case where a tile includes four 128×128 subbands that are each divided into 64×64 code-blocks, then there are four code-blocks that are coded together. The packet header indicates whether there is any data for a particular code-block, the number of zero bit planes if there is data, the length of the coded data and how many coding passes the data includes.

Table 9 illustrates one embodiment of a packet structure for packets with 2×2 code-blocks and 1 layer. Referring to Table 9, tag trees are only two levels high. The references to "z" show where the higher level zero bitplanes tag tree information goes, and the locations designated "_" show where the remaining zero bitplanes, coding passes and length information goes.

TABLE 9

Inclusion Information for 2 × 2 Code-blocks and 1 Layer.

| inclusion | code | inclusion | code |
|---|---|---|---|
| 0000 | 0* | 1000 | 111z__000 |
| 0001 | 110001z__ | 1001 | 111z__001__ |
| 0010 | 11001z__0 | 1010 | 111z__01__0 |
| 0011 | 11001z__1__ | 1011 | 111z__01__1__ |
| 0100 | 1101z__00 | 1100 | 111z__1__00 |
| 0101 | 1101z__01__ | 1101 | 111z__1__01__ |
| 0110 | 1101z__1__0 | 1110 | 111z__1__1__0 |
| 0111 | 1101z__1__1__ | 1111 | 111z__1__1__1__ |

*or 10 or 110000.

In one embodiment, a 110000 code is used when no code blocks are included for ease of implementation.

One embodiment of a procedure to write the packet headers for tile with a limited number of code-blocks and only a single layer begins with initialization that includes the following:

set minimum zero bit planes, MZP, to maximum value for each subband

In one embodiment, the maximum value for MZP is 0xF for up to 15 bitplanes or 0x1F for up to 31 bitplanes. Larger values may be used for implementations that can handle more bitplanes.

Next while coding coefficients in each code-block in the packet:

Save included or not bit

Save number of zero bitplanes

If zero bitplanes less than MZP then MZP=zero bitplanes
Save number of coding passes
Save length The Save included or not bit is set if every coefficient (after quantization) is zero, thereby indicating that the code-block is not included. Finally, after the information in the tile or subband is processed, the packet header is written as follows:

write "1"
for each subband
  write "1"
  first_flag=1
  for each code-block
    if not included then
      write "0"
    else
      write "1"
      if first_flag then
        write MZP in tag tree format
        first_flag=0
      write zero bitplanes—MZP in tag tree format
      write coding passes
      determine minimum Lblock value
      write LBlock
      write length Note that the LBlock is defined in the JPEG 2000 Standard in section B.10.7.1.

Note that the packet header is at least one byte and a JPEG 2000 compliant decoder can understand the information that is written.

When there are multiple layers, initialization of the MZP variable can be the same as for one layer. While coding each code-block, the included or not indication, the number of coding passes and the length are saved for each layer. Additionally, the following initialization is preferred.

first_flag=1
initialize Lblock for each code-block
initialize already included for each code-block to false In one embodiment, the LBlock is intialized to 3. The "already included" being true means some previous layer had coded data (i.e., the code-block has appeared before).

To write the packet header for each layer, the following procedure may be used:

write "1"
for each subband
  if layer 0 then write "1"
  for each code-block
    if not included then
      write "0"
    else
      write "1"
      if code-block not already included then
        if first_flag then
          write MZP in tag tree format
          first flag=0
        write zero bitplanes—MZP in tag tree format
        set already included
        write coding passes
        determine minimum Lblock value
        write LBlock
        write length The "already included" information can be a seperate bit for each code-block. Otherwise, an otherwise unused value of zero bitplanes can be used to indicate "already included". For example, if there are 14 bitplanes, setting zero bitplanes to 15 (0xF) can indicate "already included."

Reduced Coded Data not Using "0" Packets

In JPEG 2000, packet headers are rounded up to bytes. In some cases, however, a packet header may contain only a single zero bit or a number of bits which are less than the number of bits needed to have the packet header fall on a byte boundary. Packet headers are usually rounded to bytes by padding. Also, packet header representations are not unique and although one typically desires the use of the shortest representation as possible, in one embodiment, a representation that is not the shortest possible may be used if the extra bits that are used take the place of bit locations that will have been filled by padding. This may be particularly useful in cases where the information that is encoded in the extra bits indicates something about the next packet in a tile component level partition.

For example, if there was a single subband and none of the 2×2 blocks was included, one could output a zero packet. However, in the same amount of space, one could output a zero to indicate that there is something in the packet but there is nothing included in the top level of the tag trees. Alternatively, one could indicate that there is something in the tag trees but it is 0000 (or that there is nothing individually in the four). Thus, these extra bits may be used to give more tag tree information, which is information that would have to occur in the packet header later on and has essentially been moved up. By shifting bits up into earlier packet headers, it may be possible to reduce the size of the overall codestream by a byte (or more).

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. A method comprising:

generating two contexts, one of the two contexts for when the current bit being decoded is a zero bit and the other of the two context for when the current bit being decoded is a one bit indicating that a coefficient has become significant;

selecting one of the two context to use to decode a bit subsequent to the current bit, wherein selecting the one context is based on the current bit once decoded; and decoding the bit subsequent to the current bit using the one context.

2. A method comprising:

generating two contexts, one of the two contexts for when the current bit being decoded is a zero bit and the other of the two context for when the current bit being decoded is a one bit indicating that a coefficient has become significant;

selecting one of the two context to use to decode a bit subsequent to the current bit, wherein selecting the one context is based on the current bit once decoded; and decoding the bit subsequent to the current bit using the one context, wherein the two contexts comprise next contexts that depend on a current context as set forth below:

| current context (being used by MQ coder) | next context for "0" | next context for "1" |
|---|---|---|
| run-length | run-length or magnitude (or idle). | uniform A |

3. A method comprising:

generating two contexts, one of the two contexts for when the current bit being decoded is a zero bit and the other of the two context for when the current bit being decoded is a one bit indicating that a coefficient has become significant;

selecting one of the two context to use to decode a bit subsequent to the current bit, wherein selecting the one context is based on the current bit once decoded; and decoding the bit subsequent to the current bit using the one context, wherein the two contexts comprise next contexts that depend on a current context as set forth below:

| current context (being used by MQ coder) | next context for "0" | next context for "1" |
|---|---|---|
| magnitude bit | magnitude next coefficient | sign for current coefficient. |

4. A decoder comprising:
a context model to generate two contexts, one of the two contexts for when the current bit being decoded is a zero bit and the other of the two context for when the current bit being decoded is a one bit, where the one bit indicating that a coefficient has become significant;
a selector coupled to the context model to output one of the two contexts in response to a selection signal; and
a coder coupled to the selector to receive the one context from the selector.

5. A decoder comprising:
a context model to generate two contexts, one of the two contexts for when the current bit being decoded is a zero bit and the other of the two context for when the current bit being decoded is a one bit, where the one bit indicating that a coefficient has become significant;
a selector coupled to the context model to output one of the two contexts in response to a selection signal; and
a coder coupled to the selector to receive the one context from the selector, wherein the two contexts comprise next contexts that depend on a current context as set forth below:

| current context (being used by MQ coder) | next context for "0" | next context for "1" |
|---|---|---|
| run-length | run-length or magnitude (or idle). | uniform A |

6. A decoder comprising:
a context model to generate two contexts, one of the two contexts for when the current bit being decoded is a zero bit and the other of the two context for when the current bit being decoded is a one bit, where the one bit indicating that a coefficient has become significant;
a selector coupled to the context model to output one of the two contexts in response to a selection signal; and
a coder coupled to the selector to receive the one context from the selector, wherein the two contexts comprise next contexts that depend on a current context as set forth below:

| current context (being used by MQ coder) | next context for "0" | next context for "1" |
|---|---|---|
| magnitude bit | magnitude next coefficient | sign for current coefficient. |

7. The decoder defined in claim 4 wherein the selector comprises a multiplexer.

8. The decoder defined in claim 4 wherein the coder comprises an MQ-coder.

9. A decoder comprising:
a context model to generate two contexts, one of the two contexts for when the current bit being decoded is a zero bit and the other of the two context for when the current bit being decoded is a one bit, where the one bit indicating that a coefficient has become significant;
a selector coupled to the context model to output one of the two contexts in response to a selection signal, wherein the selection signal comprises a feedback from the coder; and
a coder coupled to the selector to receive the one context from the selector.

10. The decoder defined in claim 9 wherein the feedback comprises a decoded bit output from the coder.

11. An article of manufacture having one or more recordable media with executable instructions stored thereon which, when executed by a system, cause the system to:

generate two contexts, one of the two contexts for when the current bit being decoded is a zero bit and the other of the two context for when the current bit being decoded is a one bit indicating that a coefficient has become significant;

select one of the two context to use to decode a bit subsequent to the current bit, wherein selecting the one context is based on the current bit once decoded; and decode the bit subsequent to the current bit using the one context.

12. An article of manufacture having one or more recordable media with executable instructions stored thereon which, when executed by a system, cause the system to:

generate two contexts, one of the two contexts for when the current bit being decoded is a zero bit and the other of the two context for when the current bit being decoded is a one bit indicating that a coefficient has become significant;

select one of the two context to use to decode a bit subsequent to the current bit, wherein selecting the one context is based on the current bit once decoded; and decode the bit subsequent to the current bit using the one context, wherein the two contexts comprise next contexts that depend on a current context as set forth below:

| current context (being used by MQ coder) | next context for "0" | next context for "1" |
| --- | --- | --- |
| run-length | run-length or magnitude (or idle). | uniform A |

13. An article of manufacture having one or more recordable media with executable instructions stored thereon which, when executed by a system, cause the system to:

generate two contexts, one of the two contexts for when the current bit being decoded is a zero bit and the other of the two context for when the current bit being decoded is a one bit indicating that a coefficient has become significant;

select one of the two context to use to decode a bit subsequent to the current bit, wherein selecting the one context is based on the current bit once decoded; and decode the bit subsequent to the current bit using the one context, wherein the two contexts comprise next contexts that depend on a current context as set forth below:

| current context (being used by MQ coder) | next context for "0" | next context for "1" |
| --- | --- | --- |
| magnitude bit | magnitude next coefficient | sign for current coefficient. |

* * * * *